(12) United States Patent
Myoung et al.

(10) Patent No.: US 9,112,076 B2
(45) Date of Patent: Aug. 18, 2015

(54) GLASS SUBSTRATE MANUFACTURING METHOD AND GLASS THEREOF

(75) Inventors: Jae Min Myoung, Goyang-si (KR); Jun Jie Xiong, Seodaemun-gu (KR); Tae Il Lee, Seoul (KR)

(73) Assignee: INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 0 days.

(21) Appl. No.: 13/816,016

(22) PCT Filed: Aug. 10, 2011

(86) PCT No.: PCT/KR2011/005837
§ 371 (c)(1),
(2), (4) Date: Feb. 12, 2013

(87) PCT Pub. No.: WO2012/020981
PCT Pub. Date: Feb. 16, 2012

(65) Prior Publication Data
US 2013/0164521 A1    Jun. 27, 2013

(30) Foreign Application Priority Data

Aug. 10, 2010 (KR) .......................... 10-2010-76719
Aug. 10, 2011 (KR) .......................... 10-2011-79430

(51) Int. Cl.
*C03C 15/00* (2006.01)
*H01L 31/0392* (2006.01)
(Continued)

(52) U.S. Cl.
CPC ............ *H01L 31/0392* (2013.01); *C03C 15/00* (2013.01); *H01G 9/20* (2013.01); *H01L 31/02366* (2013.01); *G02B 2207/107* (2013.01);
(Continued)

(58) Field of Classification Search
CPC .. C03C 15/00; C03C 21/001; C03C 23/0075; C03C 23/0095; Y02T 10/88; G02B 2207/107; H01L 31/02366
USPC .......... 428/848.8, 846.9, 141, 426, 410, 64.3; 451/41, 54; 216/24, 55, 97, 99; 65/31, 65/106
See application file for complete search history.

(56) References Cited

U.S. PATENT DOCUMENTS 3,792,987 A * 2/1974 Eaton .............................. 216/97
4,086,074 A 4/1978 Minot
(Continued)

FOREIGN PATENT DOCUMENTS

KR 10-2010-0019922 A 2/2010
KR 10-2010-0019959 A 2/2010
(Continued)

*Primary Examiner* — Kevin Bernatz
(74) *Attorney, Agent, or Firm* — Lex IP Meister, PLLC

(57) ABSTRACT

A glass substrate manufacturing method of the present invention comprises forming a multi-porous structure layer which comprises nano-size pores at a surface of a glass substrate by etching the surface of the glass substrate with hydrofluoric (HF) acid or an etchant substituting for fluoride. Unlike related art methods, the glass substrate forms no additional coating layer, uses no harmful chemical material, and is given anti-reflection, anti-fogging, and super-hydrophilic characteristics through a simple process at a relatively low temperature. The glass substrate is effectively applied to various applications requiring high light transmission such as a protective filter for a display device, a solar cell, a mobile communication device, glass of a building structure, and an optical element lens.

13 Claims, 26 Drawing Sheets

(51) Int. Cl.
  *H01G 9/20* (2006.01)
  *H01L 31/0236* (2006.01)

(52) U.S. Cl.
  CPC *Y02B 10/10* (2013.01); *Y02E 10/50* (2013.01); *Y10T 428/249969* (2015.04)

(56) References Cited

U.S. PATENT DOCUMENTS

| | | | |
|---|---|---|---|
| 4,944,986 A * | 7/1990 | Zuel | 428/156 |
| 6,291,535 B1 | 9/2001 | Watanabe | |
| 6,751,387 B2 * | 6/2004 | Caron et al. | 385/123 |
| 2002/0119325 A1 | 8/2002 | Park | |
| 2002/0127432 A1 * | 9/2002 | Saito et al. | 428/846.9 |
| 2002/0190319 A1 * | 12/2002 | Borenstein | 216/99 |
| 2003/0031878 A1 * | 2/2003 | Mitani et al. | 428/410 |
| 2003/0064196 A1 * | 4/2003 | Kurachi et al. | 428/141 |
| 2003/0109202 A1 * | 6/2003 | Matsuno et al. | 451/41 |
| 2003/0150839 A1 * | 8/2003 | Kobayashi et al. | 216/97 |
| 2003/0170459 A1 | 9/2003 | Lin | |
| 2009/0239017 A1 | 9/2009 | Ishioka | |
| 2009/0297772 A1 * | 12/2009 | Tanii | 65/106 |
| 2010/0246016 A1 * | 9/2010 | Carlson et al. | 216/24 |
| 2013/0199612 A1 * | 8/2013 | Jang et al. | 136/259 |
| 2013/0215513 A1 * | 8/2013 | Liang et al. | 359/601 |
| 2013/0224386 A1 * | 8/2013 | Mader et al. | 427/353 |
| 2014/0037841 A1 * | 2/2014 | Jewhurst et al. | 427/164 |

FOREIGN PATENT DOCUMENTS

| | | | |
|---|---|---|---|
| KR | 10-2010-0051090 A | 5/2010 | |
| KR | 10-2010-0053484 | 5/2010 | |
| WO | 2011/152289 | * 12/2011 | C03C 11/00 |

* cited by examiner

GLASS SUBSTRATE MANUFACTURING METHOD AND GLASS THEREOF

TECHNICAL FIELD

The present invention relates to a glass substrate and a method of manufacturing the same, and more particularly, to an antireflective (AR) glass substrate that has both super hydrophilic and antifogging properties and a method of manufacturing the same.

BACKGROUND ART

Various methods are under development that will increase the antireflection property of a substrate that can then be used in functional units, such as a thin-film photovoltaic cell, in optical devices or optoelectronic devices. For the substrate in optical devices or optoelectronic devices, a glass substrate is widely used since it has a low cost, high transmittance of visible light and high resistance to mechanical scratches and an excellent barrier property to water and oxygen.

When an antireflective (AR) coating is formed on the glass substrate in order to impart the glass substrate with an AR property, it needs to satisfy the following conditions: (1) the thickness of the AR coating be ¼ or less of the wavelength of incident light, and (2) the refractive index of the AR coating be about 1.22 or less.

The refractive index is expressed by $n_c=(n_a n_g)^{1/2}$, where $n_c$, $n_a$ and $n_g$ are the refractive indices of the coating, air and glass, respectively. Since the refractive index of glass is typically about 1.50, the ideal value of $n_c$ is 1.22. However, dense thin-film materials that have a low refractive index of about 1.22 are not available.

Although examples for the low-refractive-index material that is used in optical devices may include silica ($SiO_2$), calcium fluoride ($CaF_2$) and magnesium fluoride ($MgF_2$), their refractive indices are 1.46, 1.44 and 1.39, respectively, which fall short of the ideal refractive index.

An alternative option is to use a coating having a porous structure, in which a coating material and air form a composite layer. In this case, the refractive index $n_{eff}$ of the composite layer is a value between the refractive index of the coating material and 1, and can be controlled by changing the fractional volume ratio.

Several methods for realizing such a porous coating on the glass substrate have been implemented. These methods involve sol-gel, a polymer and/or oxide colloid monolayer or multilayer, selective etching and dissolution of separated copolymers. However, polymers are incompatible with existing fabrication methods for electronic devices since they have the drawback of thermal, mechanical and chemical instability and are sensitive to high temperature and plasma. In addition, colloid has poor mechanical endurance due to weak bonding to the glass substrate. The other methods using vacuum processing and lithography have the drawback of high costs. Furthermore, since an additional coating layer must be formed on the glass in order to realize an antireflection property, the number of processes and the cost increase. In addition, intensive efforts are required for the selection of materials. Therefore, a method that is inexpensive, simple and applicable to a large area is important in order to fabricate an antireflective coating that exhibits high performance, is extensive, and is endurable.

In addition, during practical operations, especially in devices which operate outdoors, dust or impurities may be attached to the exposed surfaces, thereby degrading the performance of these devices. For this reason, the combination of self-cleaning and an AR property is desirable for use in outdoor photovoltaic devices, displaying devices, self-cleaning windows and vehicle windshields. Although the surface must be super-hydrophobic or super-hydrophilic for self-cleaning, the AR property and self-cleaning are competitive properties in practice. Therefore, the two properties are not realized at the same time.

According to the Wenzel model and Cassie-Baxter model, high surface roughness is required in order to satisfy super-hydrophobic or super-hydrophilic requirements. However, such a rough surface typically causes severe light scattering, and thus the AR property cannot be realized. Photo-responsive coatings ($TiO_2$, $ZnO$ or the like) can also lead to super-hydrophilicity. However, their refractive indices are too high, which is problematic.

The porous structure can be an attractive option because it has been used to manufacture AR coatings, as well as super-hydrophobic and/or super-hydrophilic layers. However, although it is crucial to reduce light scattering by controlling the pore size in order to realize a highly transparent and self-cleaning AR coating, the two properties have not been concurrently realized up to the present.

It is known that reflection from a glass surface can be reduced by removing leachable components from the glass so as to leave a skeleton layer. However, all such chemical treatments require the use of processes and complex acidic solutions that are optimized in practice for one specific type of glass, which is problematic. In addition, the processing temperature is high (>160° C.). Furthermore, in order to efficiently decrease light reflection, a second processing bath that contains dangerous chemicals, such as hydrogen fluoride (HF) or fluoride, is required. Moreover, the volume of resultant pores cannot be controlled almost through the entire process.

In the meantime, devices such as a thin-film photovoltaic cell require a glass substrate. For a photovoltaic cell, it is required to increase the transmittance of light while decreasing as much reflectance as possible, i.e. improve the antireflection property. In other words, it is possible to increase the efficiency of the photovoltaic cell by decreasing as much reflectance as possible on the surface of the glass substrate. However, in order to improve the above-described antireflection property, the approaches of the related art merely include forming a coating having the antireflection property on a glass substrate or finding a coating composition that imparts antireflection effects and coating the glass substrate using this composition (e.g. see Korean Patent Application Publication Nos. 10-2010-51090 and 10-2010-19959). However, these approaches of the related art form a separate coating layer, resulting in several problems as described above.

When a vehicle windshield is fogged, sight can be obstructed, thereby causing difficulties in driving. Concerned with this problem, United States Patent Application Publication No. 2009-0239017 proposes realizing an antifogging function by disposing a film which has an antifogging property on the front surface of the windshield. However, this also requires a separate film layer, thereby creating the above-described problems.

According to the foregoing approaches of the related art as described above, the problems require formation of a separate coating layer made of a special coating material or use of harmful chemicals in order to impart glass with an antireflection property, an antifogging property and a self-cleaning property. Furthermore, any method for imparting these properties to one piece of glass is not disclosed at all.

DISCLOSURE

Technical Problem

The present invention has been made to solve the foregoing problems with the related art and an object of the invention is to provide a method of manufacturing a piece of glass and a glass thereof, in which an antireflection property, i.e. an increase in transmittance and a decrease in reflectance, can be achieved without forming an additional coating layer on the glass.

Another object of the invention is to provide a method of manufacturing a piece of glass and a glass thereof, in which the glass having an efficient antireflection property is manufactured simply and at a low-cost.

A further object of the invention is to provide a method of manufacturing a piece of glass and a glass thereof, in which the glass having an antireflection property is manufactured without using dangerous chemicals such as hydrogen fluoride (HF) or fluoride.

A further another object of the invention is to provide a method of manufacturing a piece of glass and a glass thereof, in which the glass has super-hydrophilic and antifogging properties as well as an antireflection property.

Technical Solution

In order to realize the foregoing object, according to an aspect of the present invention, provided is a method of manufacturing a glass substrate that includes forming a layer having a porous structure of nanoscale pores on a surface of glass substrate by etching the surface of the glass substrate with an etchant that includes an alkali solution and replaces hydrofluoric acid (HF) or fluoride.

In an embodiment, the etchant is characterized by providing harmlessness compared to an etching process using HF or fluoride.

In an embodiment, the etching of the glass substrate may form the layer having the porous structure by etching the glass substrate instead of a coating layer which covers the surface of the glass substrate.

In an embodiment, a depth of the layer having the porous structure in a thickness direction of the glass substrate may be smaller than a wavelength of incident light.

In an embodiment, the depth of the layer having the porous structure may be ¼ or less of the wavelength of the incident light.

In an embodiment, the layer having the porous structure may impart the glass substrate with at least one property selected from among an antireflection property, a hydrophilic property and an antifogging property.

In an embodiment, the layer having the porous structure may have a refractive index value that continuously varies between a refractive index of air and a refractive index of the glass.

In an embodiment, the alkali solution may be a potassium hydroxide (KOH) solution.

In an embodiment, the etching in the alkali solution may be carried out at a temperature below 100° C.

In an embodiment, the etching may be carried out in a range from 0.5 hour to 4 hours, preferably, in a range from 1.5 hours to 2 hours.

In an embodiment, the alkali solution may be NaOH or LiOH.

In an embodiment, the etching in the alkali solution may be carried out at a temperature below 100° C. in a range within 4 hours.

In an embodiment, the method may further include cleaning the glass substrate before the etching.

In an embodiment, the cleaning step may be implemented as an ultrasonic cleaning process that uses at least one cleaning fluid selected from among trichloroethylene, acetone and methanol.

According to another aspect of the present invention, provided is a glass substrate that includes a first layer having a porous structure of nanoscale pores which are etched by an etchant that includes an alkali solution and replaces HF or fluoride, and a second layer which is not etched by the etchant.

In an embodiment, the first layer may be formed of a surface of the glass substrate that is etched by the etchant instead of a coating layer which is formed on the surface of the glass substrate.

In an embodiment, a depth of the first layer in a thickness direction of the glass substrate may be smaller than a wavelength of incident light, preferably, ¼ or less of the wavelength of the incident light.

In an embodiment, the first layer having the porous structure may impart the glass substrate with at least one property selected from among an antireflection property, a hydrophilic property and an antifogging property.

In an embodiment, the first layer having the porous structure may have a refractive index value that continuously varies between a refractive index of air and a refractive index of the glass.

In an embodiment, the glass substrate may be a soda-lime glass, an aluminosilicate glass or a glass for liquid crystal display (LCD).

In an embodiment, the alkali solution may be implemented as potassium hydroxide (KOH), sodium hydroxide (NaOH) or lithium hydroxide (LiOH).

According to a further aspect of the present invention, provided is a photovoltaic cell that includes a glass substrate, the glass substrate including a layer having a porous structure of nanoscale pores on a surface thereof, the nanoscale pores being formed due to etching by an etchant that contains an alkali solution and replaces HF or fluoride; a front electrode formed on the glass substrate; a semiconductor part formed on the front electrode; and a rear electrode.

According to further another aspect of the present invention, provided is a photovoltaic cell that includes a glass substrate, the glass substrate including a layer having a porous structure of nanoscale pores on a surface thereof, the nanoscale pores being formed due to etching by an etchant that contains an alkali solution and replaces HF or fluoride; a conductive transparent electrode formed on a surface of the glass substrate; an oxide semiconductor electrode which includes a metal oxide nanoparticle layer on which photosensitive dye capable of absorbing light is adsorbed; a counterpart electrode; and electrolyte disposed between the glass substrate and the counterpart electrode.

According to another aspect of the present invention, provided is a protective filter for a display device. The protective filter includes a glass substrate, the glass substrate including a layer having a porous structure of nanoscale pores on a surface thereof, the nanoscale pores being formed due to etching by an etchant that contains an alkali solution and replaces HF or fluoride; a transparent conductive film formed on the glass substrate; and an electrode part electrically connected to the transparent conductive film.

According to a further aspect of the present invention, provided is a mobile communication terminal that includes a display panel and a piece of protective glass disposed on a front side of the display panel to protect the display panel. The protective glass is configured as a piece of glass that has a layer having a porous structure of nanoscale pores on a surface thereof, the nanoscale pores being formed due to etching by an etchant that contains an alkali solution and replaces HF or fluoride.

According to further another aspect of the present invention, provided is a rearview mirror for a vehicle. The rearview mirror includes a mirror housing pivotably disposed on a mounting portion which is fixed to a windshield of the vehicle, a mirror member which is mounted such that it occupies an opening of the mirror housing, and a mirror housing cover which fixes the mirror member. The mirror member includes a glass member that has a layer having a porous structure of nanoscale pores on a surface thereof, the nanoscale pores being formed due to etching by an etchant that contains an alkali solution and replaces HF or fluoride.

According to another aspect of the present invention, provided is a lens for an optical device. The lens is configured as a piece of glass that has a layer having a porous structure of nanoscale pores on a surface thereof, the nanoscale pores being formed due to etching by an etchant that contains an alkali solution and replaces HF or fluoride.

According to yet another aspect of the present invention, provided is a glass for a building. The glass for a building is configured as a piece of glass that has a layer having a porous structure of nanoscale pores on a surface thereof, the nanoscale pores being formed due to etching by an etchant that contains an alkali solution and replaces HF or fluoride.

Advantageous Effects

According to the invention, the nanoporous structure having the refractive index that continuously varies between the refractive index of air and the refractive index of the glass is formed by etching with the alkali solution that is harmless to the human. Therefore, reflectance is significantly decreased, transmittance is enhanced, and super-hydrophilic and antifogging properties can be realized. In addition, no dangerous chemicals are used, no process for forming an additional coating layer is required, and antireflection property and self-cleaning property can be concurrently achieved via low-temperature etching. Furthermore, the nanoporous structure which exhibits optimum transmittance/reflectance can be formed by controlling the glass composition and etching time.

BEST MODE

Figure 1:
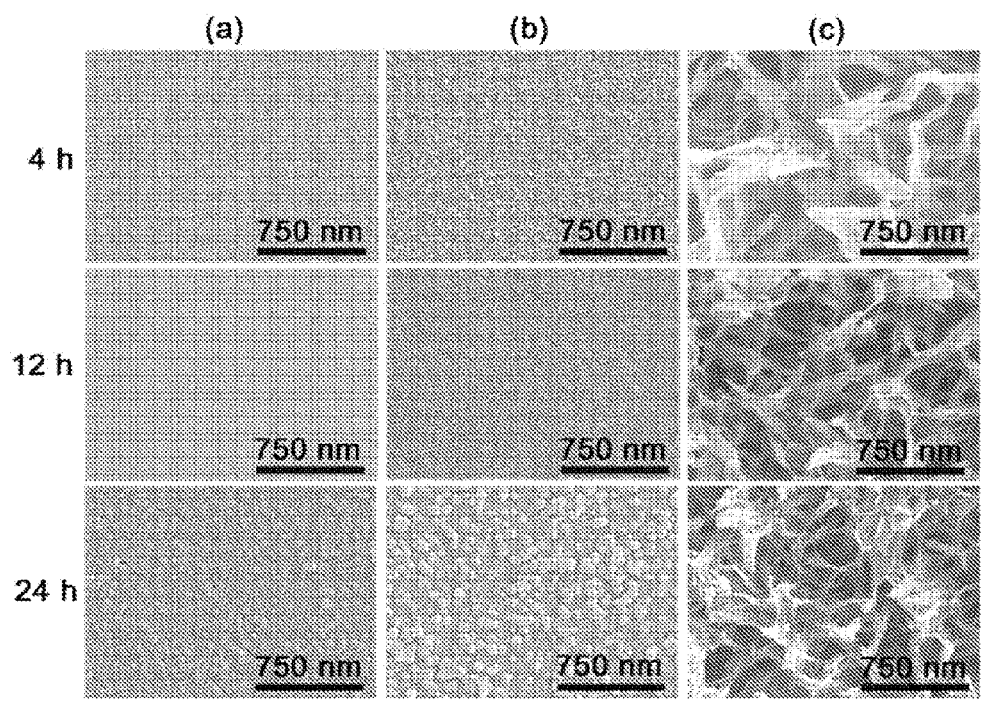
FIG. 1 is a picture showing scanning electron microscopy (SEM) surface images of glass substrate samples depending on different etching times [(a): glass sample A, (b): glass sample B, (C): glass sample C]

Reference will now be made in detail to various embodiments of the present invention, examples of which are illustrated in the accompanying drawings. In the following description, descriptions of technical parts that are well known in the art will be omitted. Although such descriptions are omitted, the characteristic features of the invention will be apparent to a person having ordinary skill in the art from the following description.

The invention discloses a glass substrate which has a porous surface layer having controllable wettability and AR properties and a method of manufacturing the same, in which the controllable wettability and AR properties are realized by etching a typical glass substrate in an alkali solution (e.g. potassium hydroxide (KOH)) at low temperature (95° C.). The resultant glass substrate has enhanced transmittance (or decreased reflectance) (up to 97.7%) within a wide wavelength range, super-hydrophilicity, self-cleaning and antifogging properties.

This glass substrate provides advantages to devices which operate outdoors, such as thin-film photovoltaic cells, display devices and vehicle windshields, in which several characteristics including an antireflection property is required. Morphology and optical properties can be controlled by changing the etching time and glass compositions.

The present invention will be described in more detail with reference to specific experimental examples.

1. First Embodiment

The inventors prepared three sorts of glass substrates having compositions presented in Table 1 below [A: soda-lime glass (with a relatively high Na content), B: soda-lime glass (with a relatively low Na content), C: aluminosilicate glass (with a relatively high Al content)], and carried out experiments on the three sorts of glass.

TABLE 1

| Sample | Types | $SiO_2$ | $Na_2O$ | CaO | MgO | $Al_2O_3$ | Others |
|---|---|---|---|---|---|---|---|
| A | soda-lime | 61.58 | 27.42 | 2.09 | 7.12 | 1.49 | 0.30 |
| B | soda-lime | 64.80 | 24.08 | 2.01 | 7.05 | 1.60 | 0.46 |
| C | aluminosilicate | 76.81 | 0.35 | 2.12 | 0.83 | 19.72 | 0.17 |

First, slides of the three sorts of glass substrates having compositions presented in Table 1 were cleaned by sonication with trichloroethylene, acetone and methanol, and then rinsed with deionized (DI) water. After drying in $N_2$ gas, the glass substrates were etched by immersing them in 50 ml of a 0.1 M potassium hydroxide (KOH) solution for a predetermined time. Afterwards, the glass substrates were placed in a water bath (95° C.) for different lengths of time. Finally, the glass substrates were removed and rinsed with DI water.

The surface morphology of the etched glass was determined using a field emission scanning electron microscope (FESEM, Hitachi S-4200), and glass compositions before and after etching were measured using an energy dispersive spectrum (EDS, Oxford Instruments). In order to study optical properties, the UV-VIS-NIR transmittance and reflectance of films were recorded using a spectrophotometer (Jasco V-570). In addition, the static and dynamic contact angles (CA) of water droplets were measured using a CA analyzer (Phoenix-300, SEO).

As is well known, an unetched glass surface is very smooth. However, the glass surface was etched as a result of immersing the glass substrate in the alkali solution (KOH in this embodiment) according to the above-described process. Specifically, the dense glass surface was separated into nanoflakes, between which nanoscale pores were formed on both sides of the glass substrate. The morphology and optical properties can be controlled by changing the etching time and glass composition (which will be described later).

FIG. 1 shows scanning electron microscopy (SEM) surface images of glass substrates (samples A, B and C) after being etched for different lengths of time (4 hours, 12 hours and hours). Glass substrate sample A exhibits a uniform porous surface having a pore size of about 50 nm after being etched for up to 4 hours. When the etching time increased to 12 hours, the nanoflakes split into smaller flakes. After a longer etching time (24 hours), granular particles (100 nm to 200 nm) consisting of nanoflakes were formed on the porous surface.

Glass substrate sample B exhibits a very similar morphology after being etched, but the size of pores and the size of granular particles are 2 to 3 times those of glass substrate sample A.

In contrast, glass substrate sample C exhibits a different morphology. Nanoflakes are very thick and large, with interstitial spaces being formed therebetween. The surface roughness of glass substrate sample C is much greater than those of glass substrate samples A and B, and after the longer etching time (24 hours), nanoflakes were separated without forming any particles.

Thus, the inventors found that it is possible to form a porous layer having nanoscale pores in the surface of the glass substrate by etching the glass and that the size of pores in the porous layer can be controlled by changing the glass composition. The thickness of the porous layer can be estimated from a cross-sectional SEM image (not shown) of the porous layer.

Figure 2:
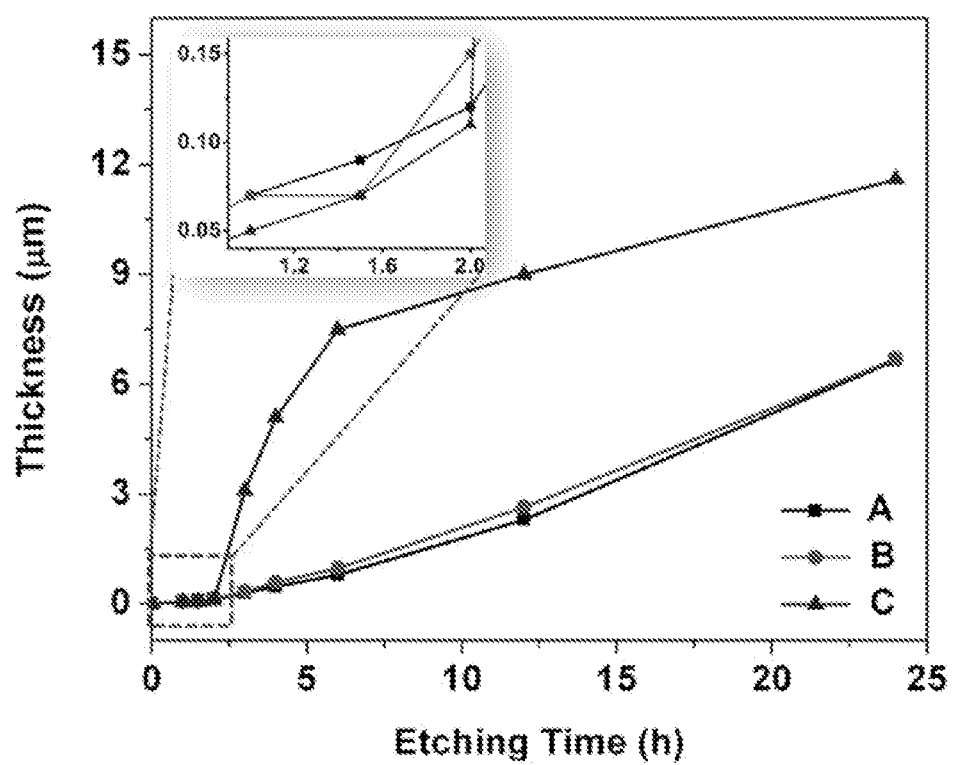
FIG. 2 shows the thickness of the nanoporous layers formed on glass samples depending on different etching times.

FIG. 2 shows the thickness of porous layers of three glass substrates that were etched for several hours.

Referring to FIG. 2, soda-lime glass substrate samples A and B exhibit a linear increase in the thickness of the porous layer. In contrast, in aluminosilicate glass substrate sample C, initially (<2 hours), the thickness of the porous layer very slowly and linearly increases, but after 2 hours, the etching rate exponentially increases and finally becomes saturated.

After finding that the porous structure can be formed in the surface of the glass substrate according to the above-described process, the inventors evaluated the antireflection property of the glass substrates that have the porous structure. The reflectance and transmittance of the glass substrate samples were measured, and the results are presented in FIG. 3 to FIG. 5.

Figure 3:
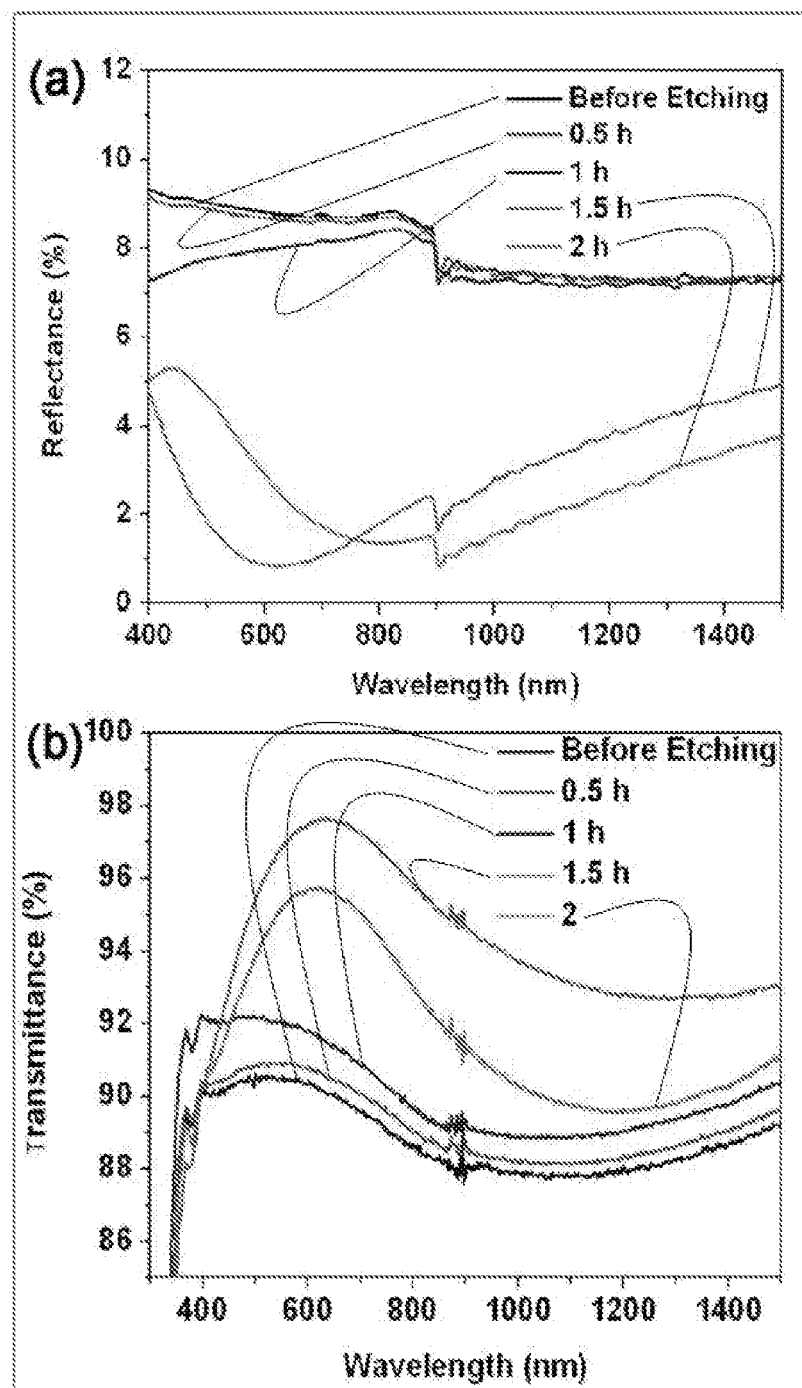
FIG. 3(a) shows reflectance spectra of glass sample A before and after etching.
FIG. 3(b) shows transmittance spectra of glass sample A before and after etching.
Figure 4:
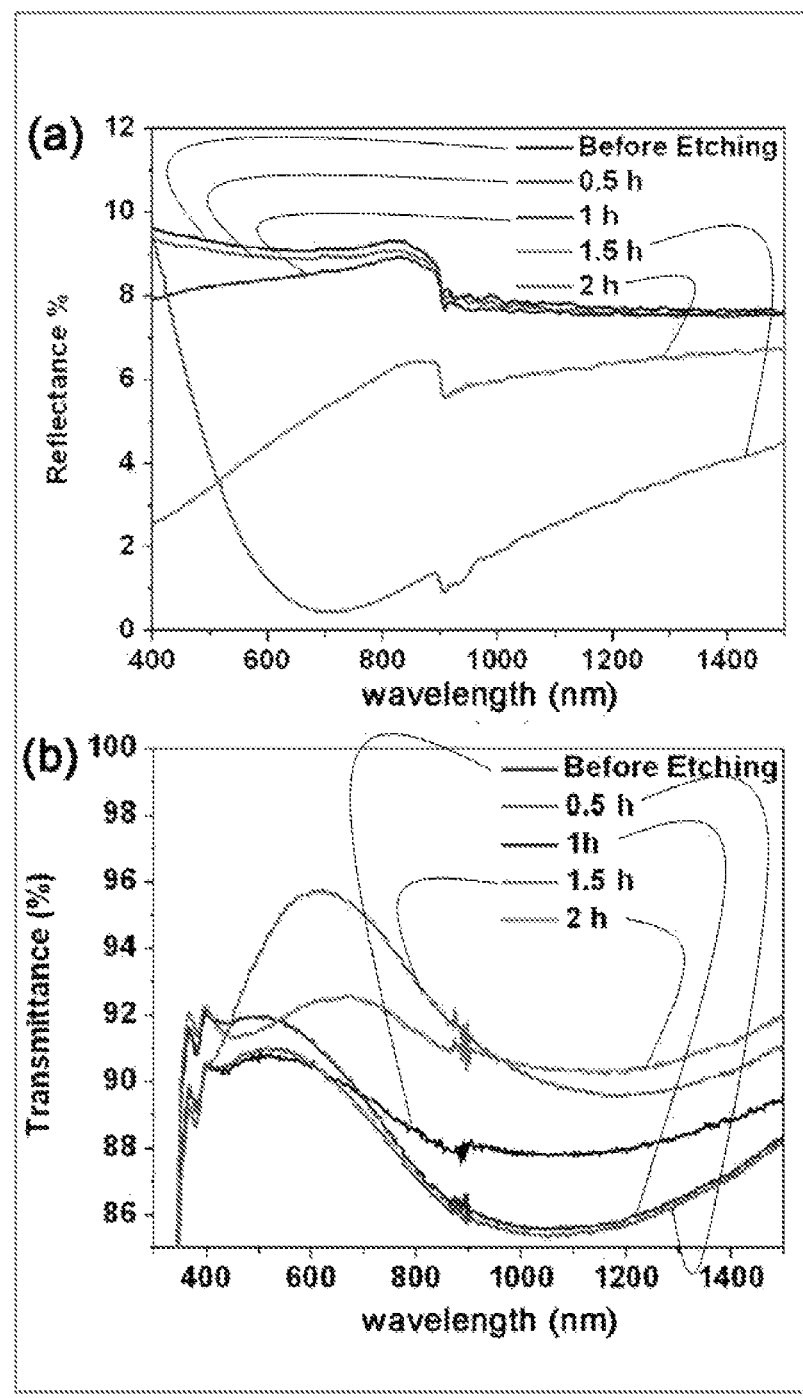
FIG. 4(a) shows reflectance spectra of glass sample B before and after etching.
FIG. 4(b) shows transmittance spectra of glass sample B before and after etching.
Figure 5:
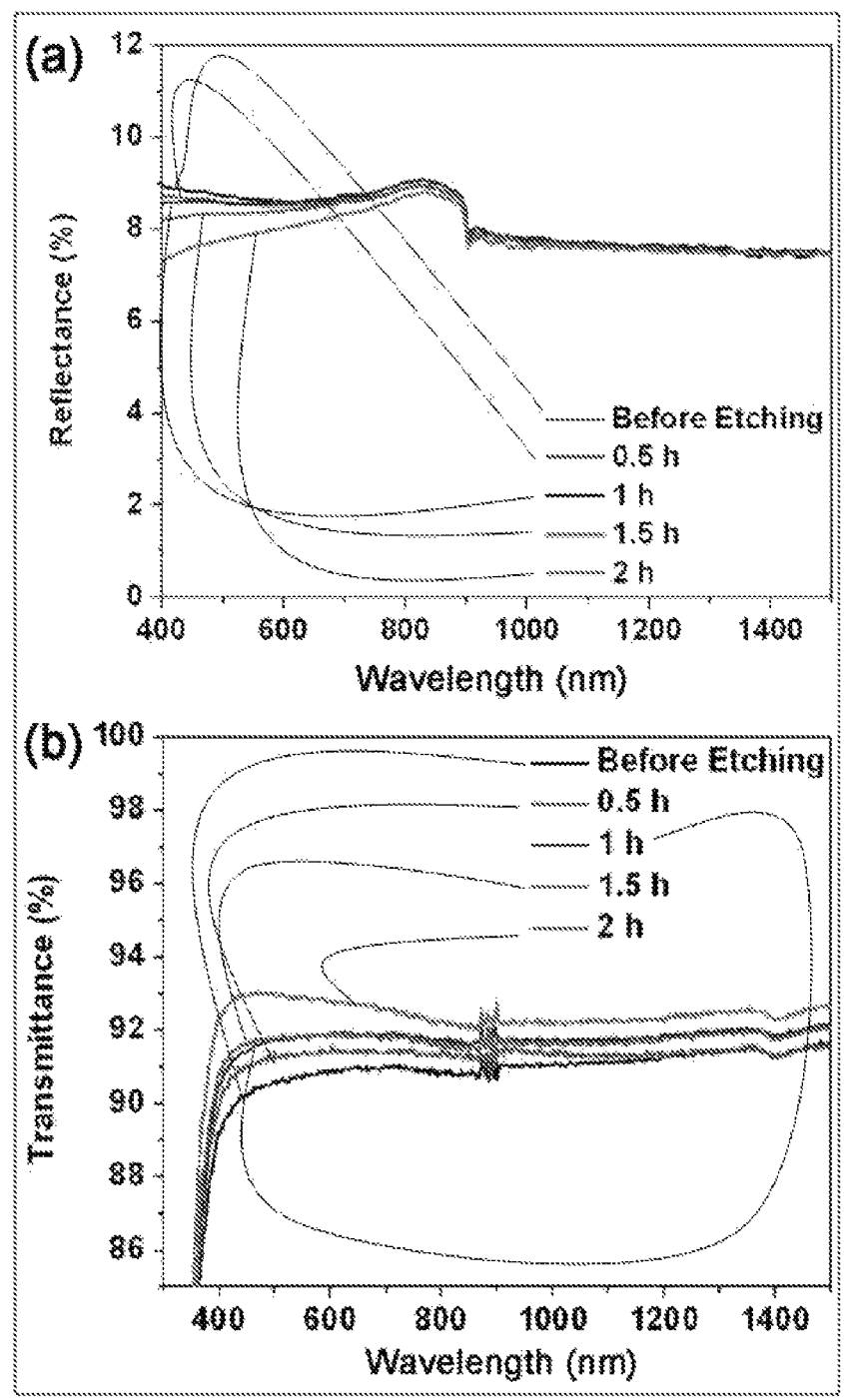
FIG. 5(a) shows reflectance spectra of glass sample C before and after etching.
FIG. 5(b) shows transmittance spectra of glass sample C before and after etching.

In FIG. 3, (a) shows variations in the reflectance of glass sample A depending on the wavelengths before and after etching, and (b) shows variations in the transmittance of glass sample A depending on the wavelengths before and after etching. In FIG. 4, (a) shows variations in the reflectance of glass sample B depending on the wavelengths before and after etching, and (b) shows variations in the transmittance of glass sample B depending on the wavelengths before and after etching. In FIG. 5, (a) shows variations in the reflectance of glass sample C depending on the wavelengths before and after etching, and (b) shows variations in the transmittance of glass sample C depending on the wavelengths before and after etching.

First, in the case of glass substrate sample A, the glass substrate sample shows an average reflectance of about 9% in the range from 400 nm to 1500 nm before etching. After being etched for a short time (0.5 hour), the reflectance decreases over the entire range. As the etching time increases, the reflectance decreases. The lowest reflectance was obtained at about 630 nm (0.95%) after being etched for 1.5 hours. When the etching time exceeds 1.5 hours, the reflectance increases again (the reflectance increases but is lower than that of unetched glass), which seems to be due to the increase in the thickness of the porous layer.

The decrease in the reflectance can lead to an increase in transmittance since the size of the nanopores of the porous layer which is formed in the glass surface according to the invention, i.e. the size of the glass substrate in the thickness direction (i.e. thickness), is much smaller than the wavelength of visible light. In particular, when the thickness of the porous layer is smaller than ¼ of the wavelength of incident light, scattering is prevented and an antireflection property is achieved. Referring to transmittance, before etching, glass substrate sample A exhibits an average transmittance of 89% in the range from 400 nm to 1500 nm. The transmittance increases over the entire range as the etching time increases. After being etched for 1.5 hours, an optimized average transmittance of 94.5% and a maximum transmittance of 97.7% were observed at about 630 nm. When the etching time further increases, the transmittance begins to decrease due to the increase in the thickness of the porous layer. Particles also act as scattering centers, thereby decreasing transmittance.

In addition, glass substrate sample B exhibits similar properties to glass substrate sample A since its composition is similar to that of glass substrate sample A. However, the maximum transmittance decreases to 95.7% (at about 630 nm). The minimum reflectance is obtained at 640 nm (0.75%) for an etching time of 1.5 hours. Furthermore, glass substrate sample C exhibits a slow change in reflectance and transmittance as the etching time increases (up to 2 hours). The fluctuation in reflectance and transmittance as a function of wavelength is small. For a longer etching time exceeding 2 hours, the transmittance drastically decreases due to the greater thickness of the porous layer.

As described above, it is clear that the initial composition of the glass substrate plays an important role in order to determine its antireflection property.

In addition, glass requires a low refractive index of about 1.22 in order to minimize light reflection. Based on the effective medium theory, $n_{eff}$ of a certain composite layer is calculated in Formula 1 below.

$$n_{eff} = [n_c^2 f + n_{Air}^2 (1-f)]^2 \quad \text{[Formula 1]}$$

In Formula 1 above, $n_c$ and $n_{Air}$ are refractive indices of the coating and air, respectively, and f is a filling factor. The porous layer has a lower $n_{eff}$ due to the existence of air in the interstitial space. When the $n_{eff}$ of the composite layer is close to the ideal value of 1.22, the reflectance can be effectively decreased. In the current application, f is controlled by the pore size, which is highly dependent on the etching time and glass composition. In addition, as the glass is gradually etched, the $n_{eff}$ of the porous layer will gradually change from the top to the bottom of the glass. This also favors antireflection effects over the wide range. (Antireflection effects exist over the wide range since pores vary in size in the porous layer.)

The inventors also evaluated the wettability of the above-described glass substrate as follows:

The rough and porous nature of the etched glass surface can dramatically enhance hydrophilicity. The relationship between the apparent CA of a liquid droplet on a surface and the roughness is given by the Wenzel equation of Formula 2.

$$\cos \theta^w = \gamma \cos \theta \quad \text{[Formula 2]}$$

In Formula 2 above, $\theta^w$ is the observed apparent CA on a rough surface, $\theta$ is the corresponding CA on a smooth surface, and $\gamma$ is the surface roughness defined as the ratio of the actual surface area over a projected surface area. The value of $\gamma$ is very high for porous materials, meaning that complete wetting can be expected when a liquid droplet drops on the surface of the glass substrate. The wetting behavior of the etched glasses was examined using a video CA instrument which operates at a capture speed of 500 frames/s (time interval between frames is 2 ms).

Figure 6:
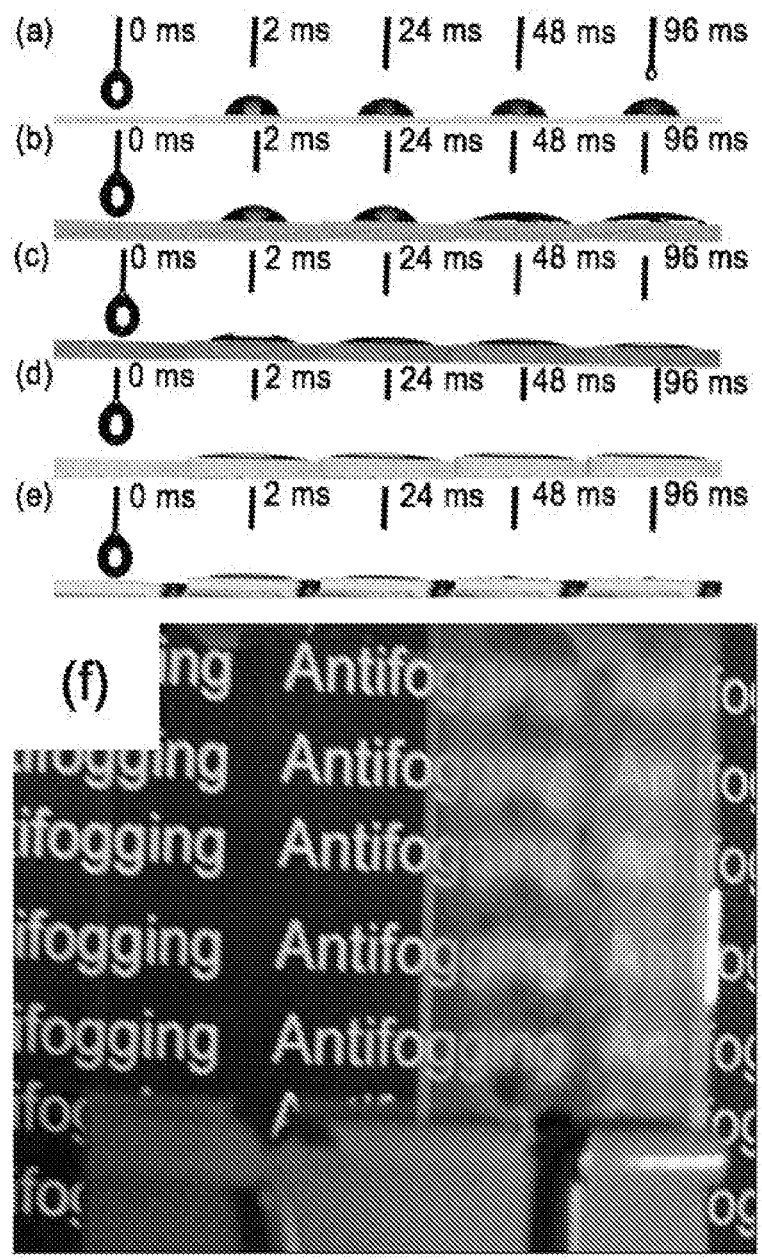
FIG. 6 shows the dynamic contact angles of glass sample A before and after etching, in which (a) shows contact angles before etching, (b) shows contact angles after being etched for 0.5 hour, (c) shows contact angles after being etched for 1 hour, (d) shows contact angles after being etched for 2 hours, (e) shows contact angles after being etched for 4 hours, and (f) shows the antifogging property of an etched glass substrate.
Figure 7:
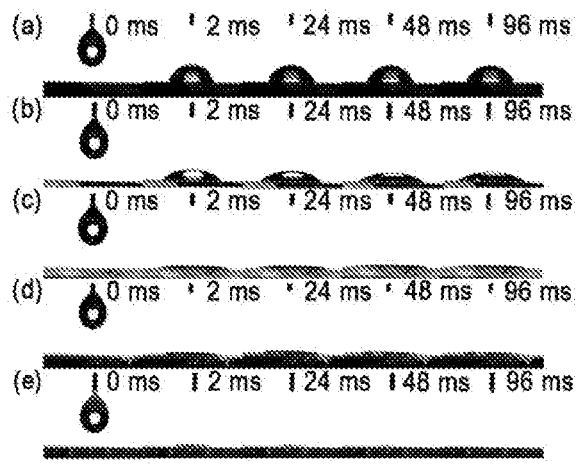
FIG. 7 shows the dynamic contact angles of glass sample B before and after etching, in which (a) shows contact angles before etching, (b) shows contact angles after being etched for 0.5 hour, (c) shows contact angles after being etched for 1 hour, (d) shows contact angles after being etched for 2 hours, and (e) shows contact angles after being etched for 4 hours.
Figure 8:
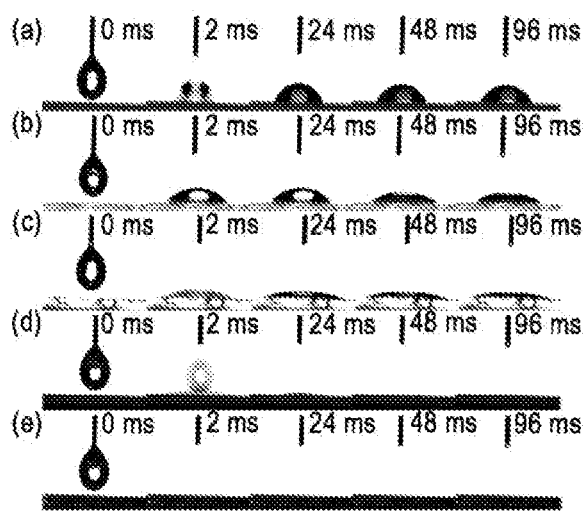
FIG. 8 shows the dynamic contact angles of glass sample C before and after etching, in which (a) shows contact angles before etching, (b) shows contact angles after being etched for 0.5 hour, (c) shows contact angles after being etched for 1 hour, (d) shows contact angles after being etched for 2 hours, and (e) shows contact angles after being etched for 4 hours.

The liquid droplet CAs for glass substrates A, B and C before and after etching are presented in FIG. 6 to FIG. 8.

FIG. 6 shows the dynamic contact angles of glass sample A before and after etching, in which (a) shows contact angles before etching, (b) shows contact angles after being etched for 0.5 hour, (c) shows contact angles after being etched for 1 hour, (d) shows contact angles after being etched for 2 hours, (e) shows contact angles after being etched for 4 hours, and (f) shows the antifogging property of an etched glass substrate. FIG. 7 shows dynamic contact angles of glass sample B before and after etching, in which (a) shows contact angles before etching, (b) shows contact angles after being etched for 0.5 hour, (c) shows contact angles after being etched for 1 hour, (d) shows contact angles after being etched for 2 hours, and (e) shows contact angles after being etched for 4 hours. FIG. 8 shows dynamic contact angles of glass sample C before and after etching, in which (a) shows contact angles before etching, (b) shows contact angles after being etched for 0.5 hour, (c) shows contact angles after being etched for 1 hour, (d) shows contact angles after being etched for 2 hours, and (e) shows contact angles after being etched for 4 hours.

First, in case of glass substrate sample A, the initial CA of the liquid droplet when just touching the surface of the glass substrate is 76°. The CA gradually decreases to 65° after approximately 0.1 second. As the etching time increases (0 to 4 hours), the surface become more hydrophilic, which can be indicated by the decrease in the initial CA. The CA also decreases quickly over time after the liquid droplet has dropped on the surface.

In the present invention, the thickness of the porous layer plays an important role in order to achieve the super-hydrophilic surface. As the etching time increases from 0.5 hour to 4 hours (the thickness increases from 70 nm to 480 nm), the wetting time for the liquid droplet to be added to the surface becomes remarkably faster (i.e. as the etching time increases, the wetting time decreases). For the sample etched for 4 hours, no CA could be measured within 48 ms because the CA was extremely small, which shows that the glass of the invention exhibits a super-hydrophilic property (CA<5°).

Super-hydrophilicity originates from two events: 1) the porous structure allows water to spread over and penetrate through the surface, and 2) there is an abundance of hydrophilic Si-OH bonds during etching.

Glass substrates B and C exhibit better hydrophilic properties due to the thicker layer and the greater pore size. Unlike $TiO_2$-based coatings that exhibit a photocatalysis characteristic, the super-hydrophilicity of the etched glasses according to the invention does not require UV irradiation, and thus the etched glasses can be used in the dark.

In addition, super-hydrophilicity can also lead to the antifogging property. For normal glass, moisture will condense as discrete droplets on the surface of the glass, thereby scattering light. However, after being etched as above, the glass surface becomes hydrophilic and thus has an ability to prevent scatting and fogging by allowing condensation to form a continuous thin film. The antifogging property of the glass surfaces of the invention was proven by exposing the etched glass (glass A, etched for 4 hours) and the unetched glass to steam after being cooled at a low temperature (−10° C.), and the results are presented in FIG. 6(f). As expected, the etched glass remained clear (right in FIG. 6(f)), whereas the unetched glass fogged immediately (right in FIG. 6(f)). Therefore, it was proven that the etched glass according to the invention exhibits a superior antifogging property compared to the unetched glass.

A more detailed description will be given below of the mechanism with which the characteristics of the etched glass are realized.

Atoms in glass form extended three-dimensional networks, which lack symmetry and periodicity. Cations in the glass can be divided into three groups: (1) network formers (Si, Zr, B), (2) network modifiers (Na, Ca) and (3) intermediates (Al, Mg). For network formers and network modifiers, bonding energies to oxygen are greater than 335 kJ/mol and less than 210 kJ/mol. For intermediates, bonding energy is between 210 kJ/mol and 335 kJ/mol.

The ratio of these cations in glass is important in determining corrosion behavior. Although the corrosion mechanism is not clear, there are some reactions that occur during corrosion: (a) hydration and hydrolysis; (2) ion exchange; and (3) network reconstruction. Water molecules can react with the glass surface by a hydrolysis reaction that is intrinsically combined with a reverse condensation reaction, as presented in Formula 3. The hydrolysis reaction can be accompanied by a network dissolution reaction (see Formula 4) by releasing water soluble compounds such as $Si(OH)_4$ into a solution and leaving large voids for further reaction.

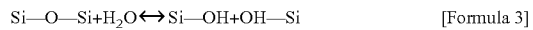

Si—O—Si+$H_2$O ↔ Si—OH+OH—Si     [Formula 3]

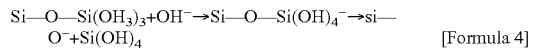

Si—O—Si($OH_3$)$_3$+$OH^-$ → Si—O—Si$(OH)_4^-$ → si—$O^-$+Si$(OH)_4$     [Formula 4]

In the present invention, the network dissolution reaction plays an important role due to the high concentration of $OH^-$. Ion exchange is the replacement of glass modifier cations ($Na^+$, $K^+$, $Ca^{2+}$ and the like) with protons, which originate from water molecules having the form of $H_2O$ and/or $H_3O^+$, as presented in Formula 5 and Formula 6.

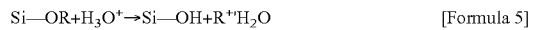

Si—OR+$H_3O^+$ → Si—OH+$R^+$·$H_2O$     [Formula 5]

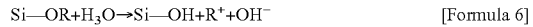

Si—OR+$H_3O$ → Si—OH+$R^+$+$OH^-$     [Formula 6]

Silanol groups (Si—OH) generated via ion exchange can condense into a Si—O—Si network by dehydration, as presented in the reverse reaction of Formula 3. This leads to reconstruction of the glass surface to form a porous material resembling an aggregation of colloidal silica particles, referred to as network reconstruction. Corrosion of the glass is initiated by a hydrolysis reaction, which also opens channels through which the ion exchange is to take place. The ion exchange reaction provides voids that allow water and ions to penetrate into the glass. Hence, the corrosion tend to occur at domains near the modifier ions, and more modifier ions in that the structure can lead to more etching channels.

The inventors measured variations in the element composition that occur during etching, based on EDS spectra on the top surfaces of glass substrates A, B and C before and after etching. As presented in Table 1, soda-lime glass substrates A and B exhibit a high concentration of Na. The Na concentration of glass substrate A (27.42%) is slightly higher than that of glass substrate B (24.08%). For glass substrate C (aluminosilicate glass), the Na concentration is much lower (0.35%), and the concentration of intermediate Al is very high (19.72%) compared to glass substrates A and B. The Si contents of these glass substrates are 61.58% (A) <64.80% (B) <76.81% (C).

Figure 9:
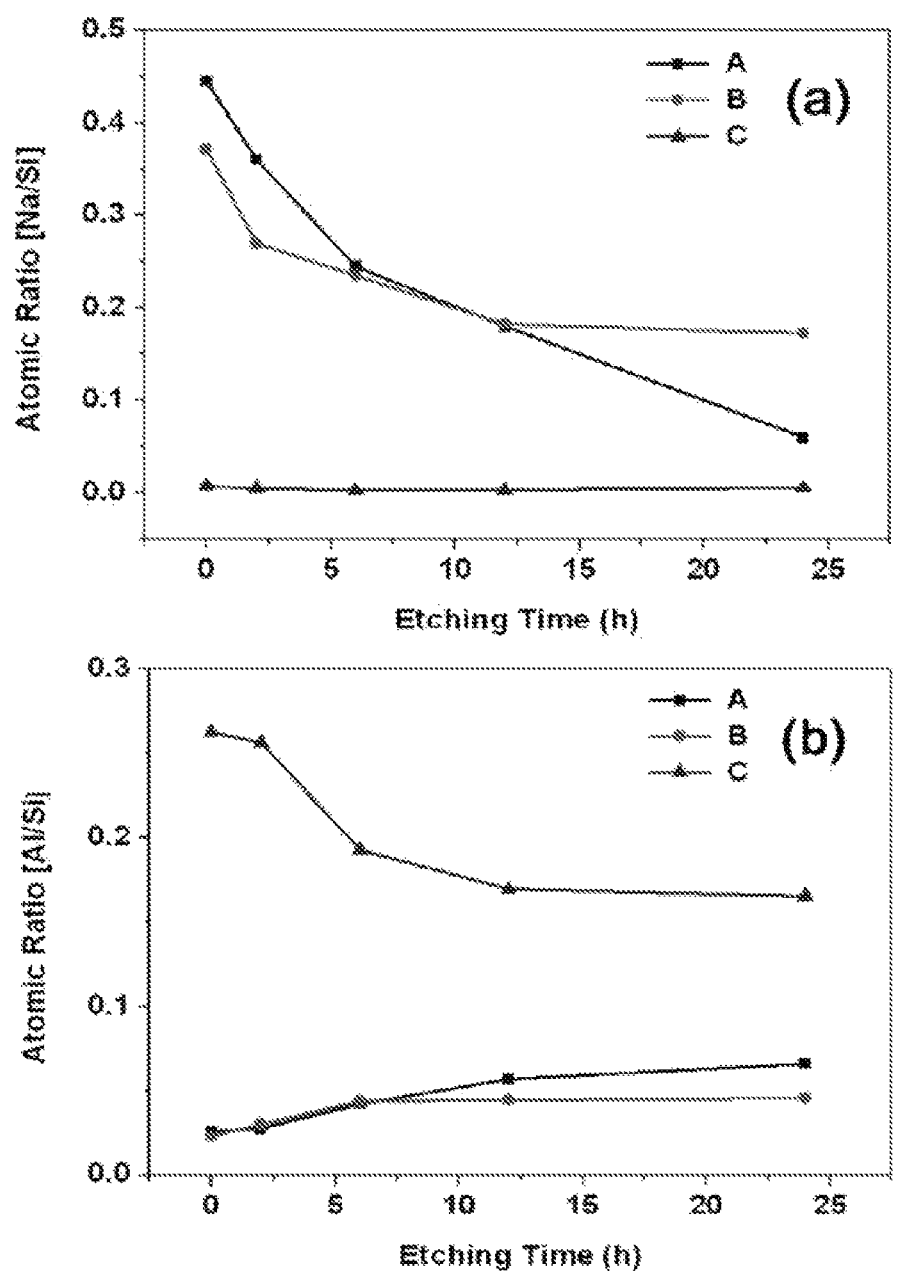
FIG. 9 shows variations in the atomic ratio (M/Si) that change as a function of etching time of glass substrates, in which (a) shows a Na/Si ratio, and (b) shows an Al/Si ratio.
Figure 10:
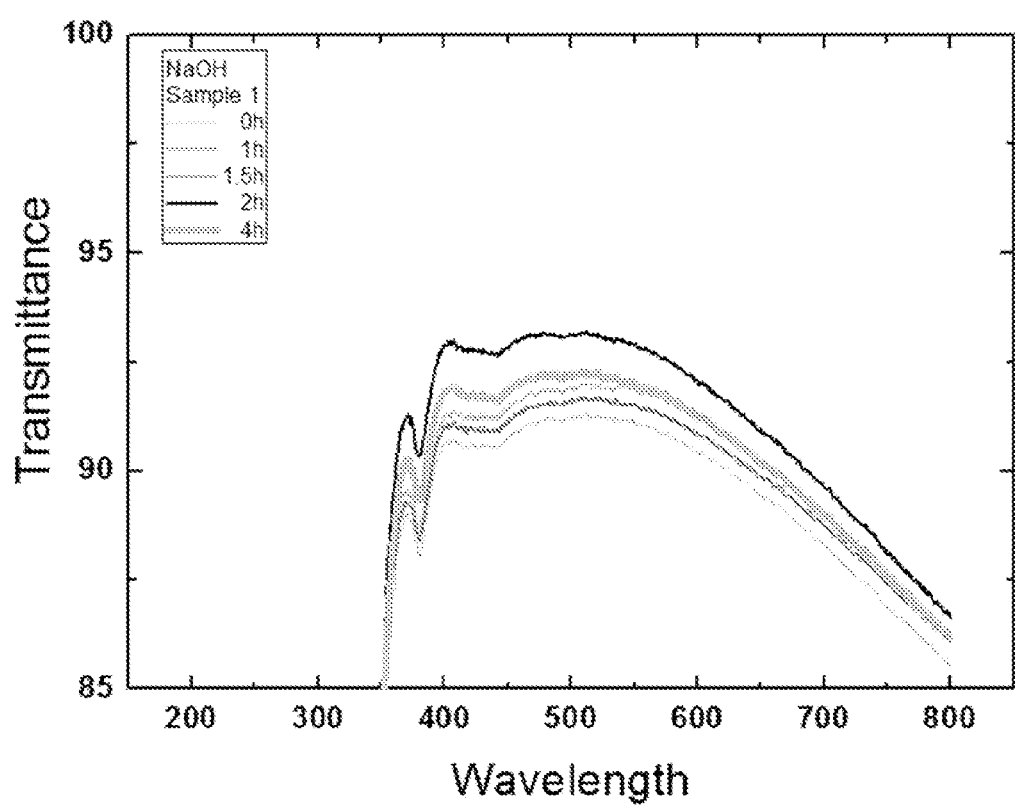
FIG. 10, FIG. 11 and FIG. 12 are views showing variations in the transmittance of sample 1, sample 2 and sample 3 depending on the wavelengths of light after being etched for several hours with a sodium hydroxide (NaOH) etching solution in a second embodiment of the invention.
Figure 11:
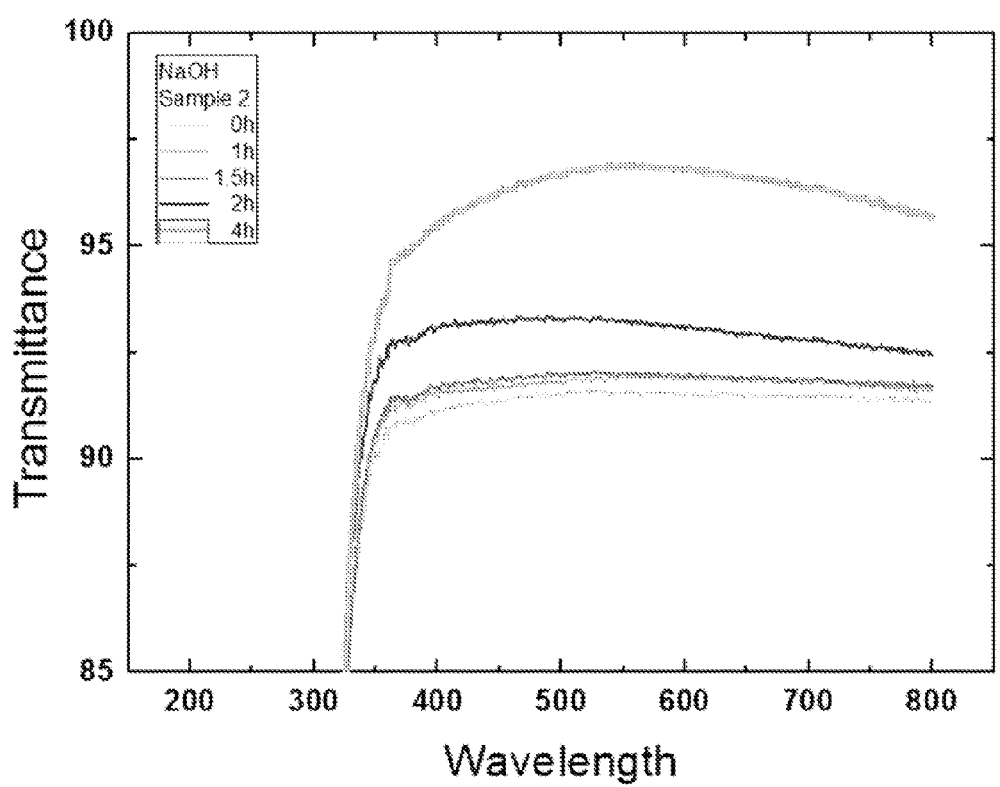
Figure 12:
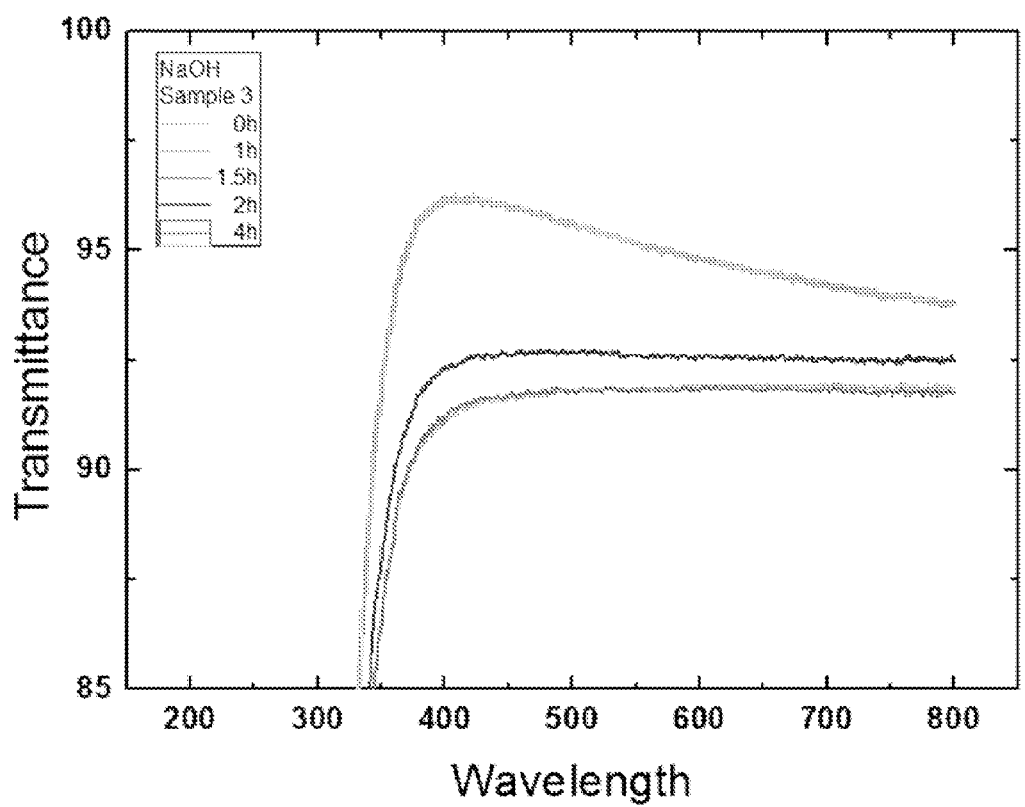
Figure 13:
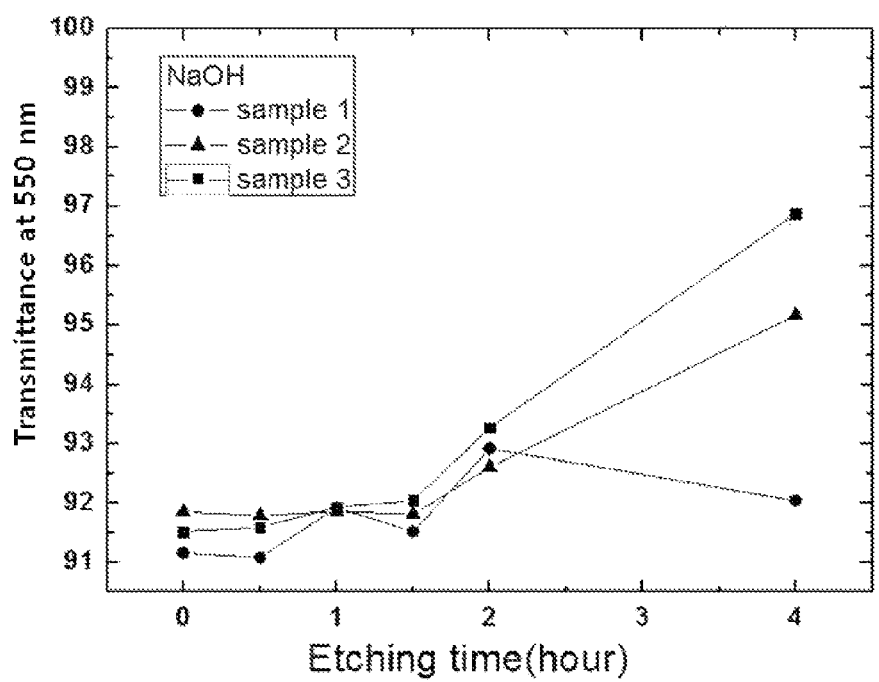
FIG. 13 is a view showing variations in the transmittance of sample 1, sample 2 and sample 3 at a specific wavelength (550 nm) depending on the etching times after being etched with NaOH.
Figure 14:
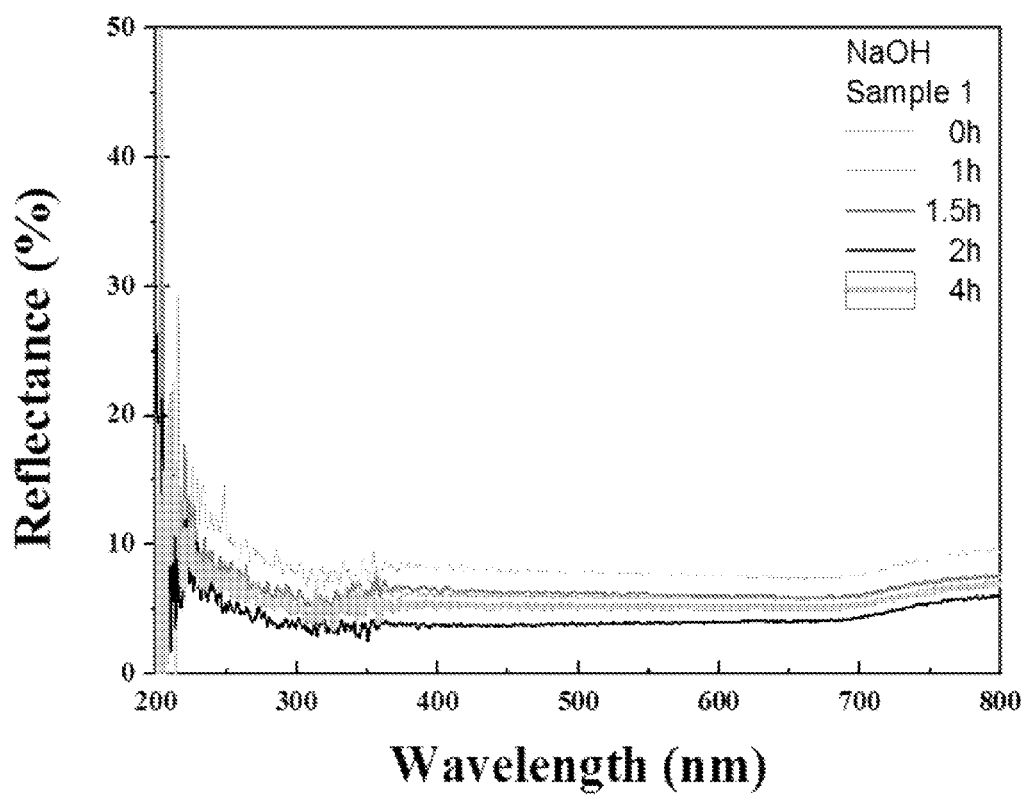
FIG. 14, FIG. 15 and FIG. 16 are views showing variations in the reflectance of sample 1, sample 2 and sample 3 depending on the wavelengths of light after being etched for several hours with a NaOH etching solution in the second embodiment of the invention.
Figure 15:
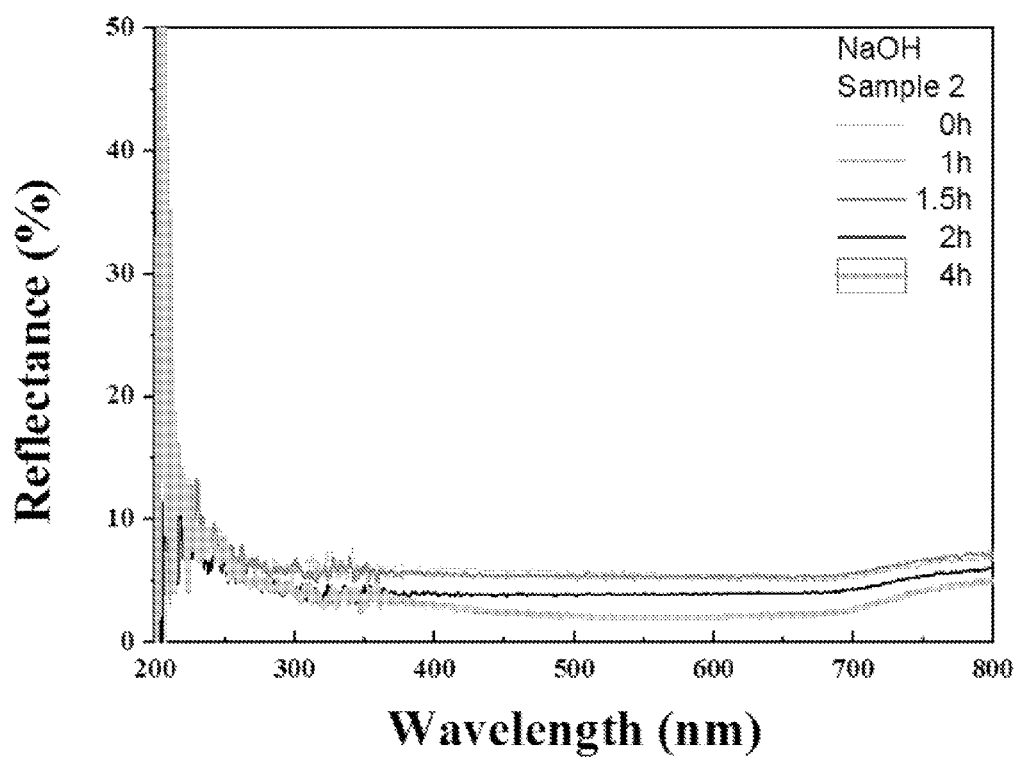
Figure 16:
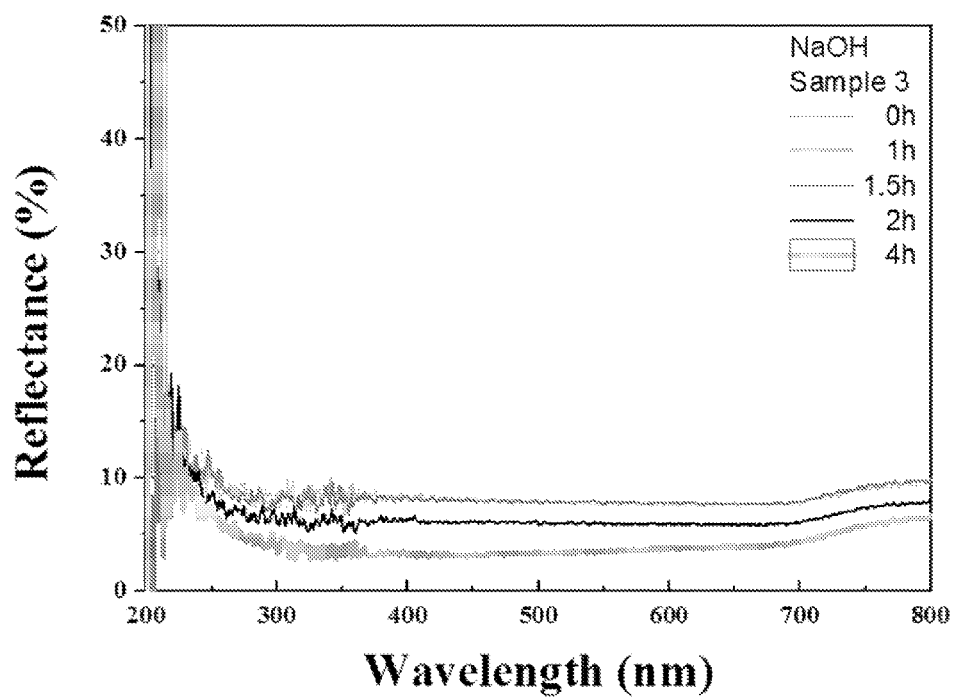
Figure 17:
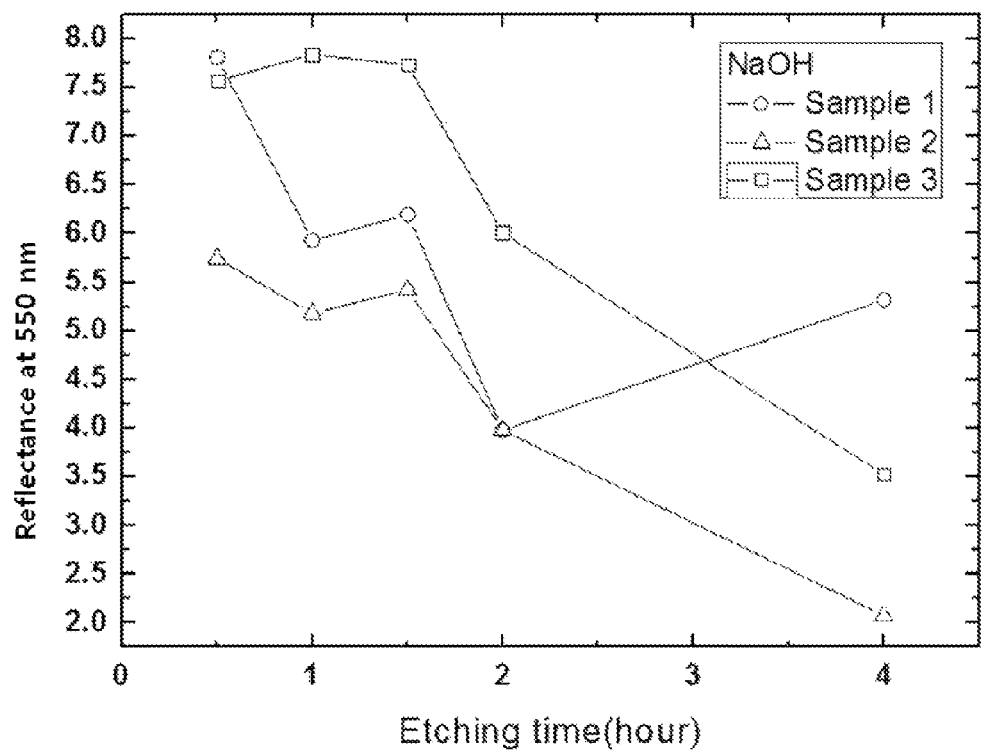
FIG. 17 is a view showing variations in the reflectance of sample 1, sample 2 and sample 3 at a specific wavelength (550 nm) depending on the etching times after being etched with NaOH.
Figure 18:
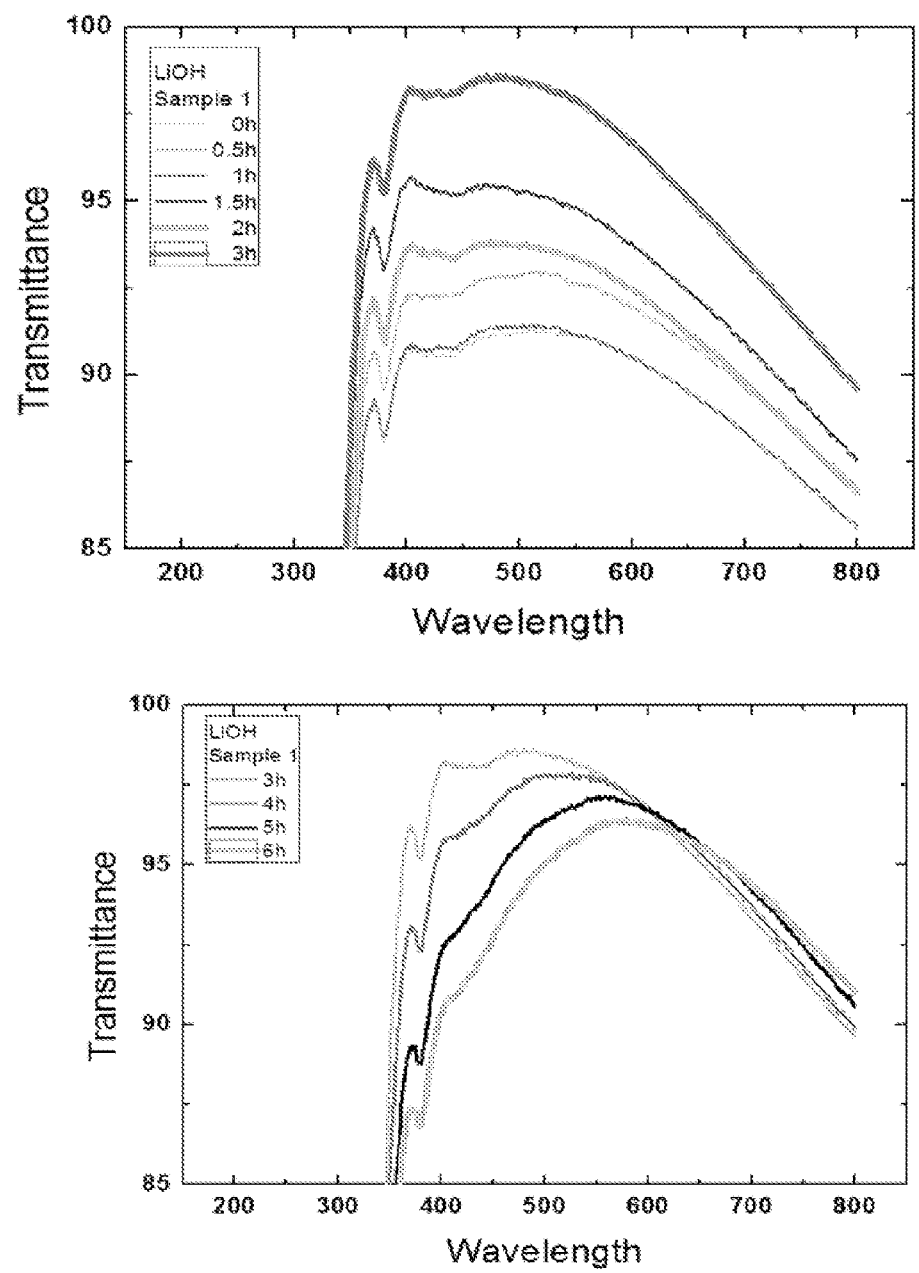
FIG. 18, FIG. 19 and FIG. 20 are views showing variations in the transmittance of sample 1, sample 2 and sample 3 depending on the wavelengths of light after being etched for several hours with a lithium hydroxide (LiOH) etching solution in the second embodiment of the invention.
Figure 19:
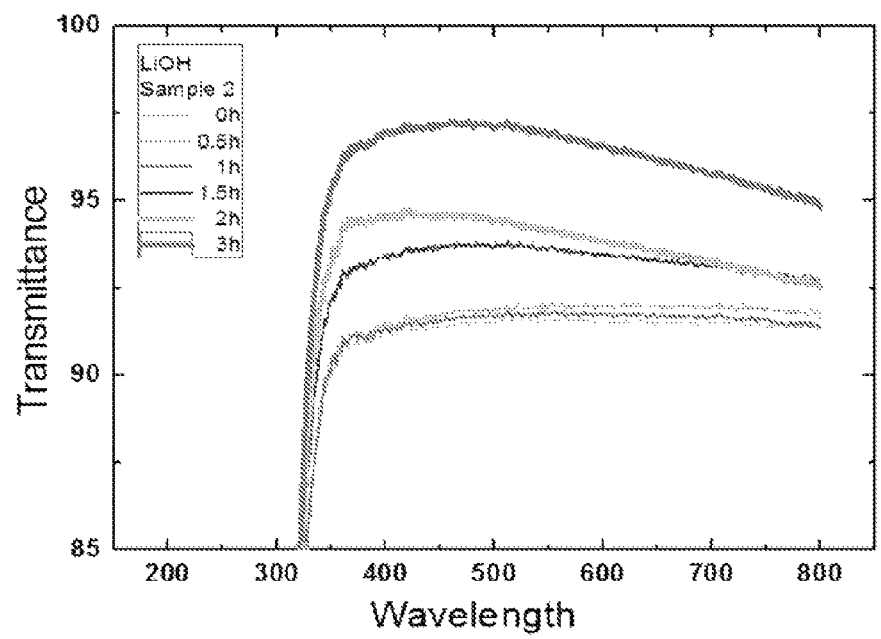
Figure 19:
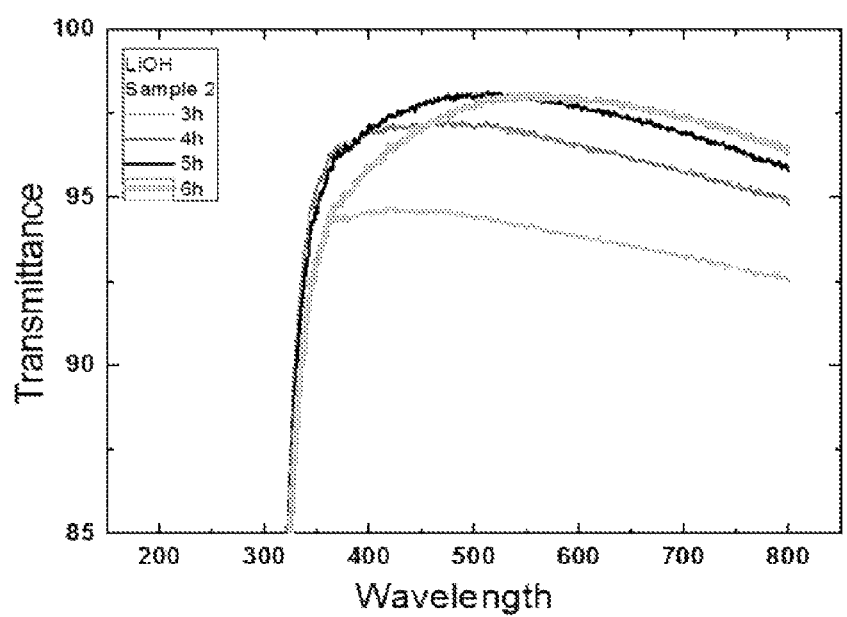
Figure 20:
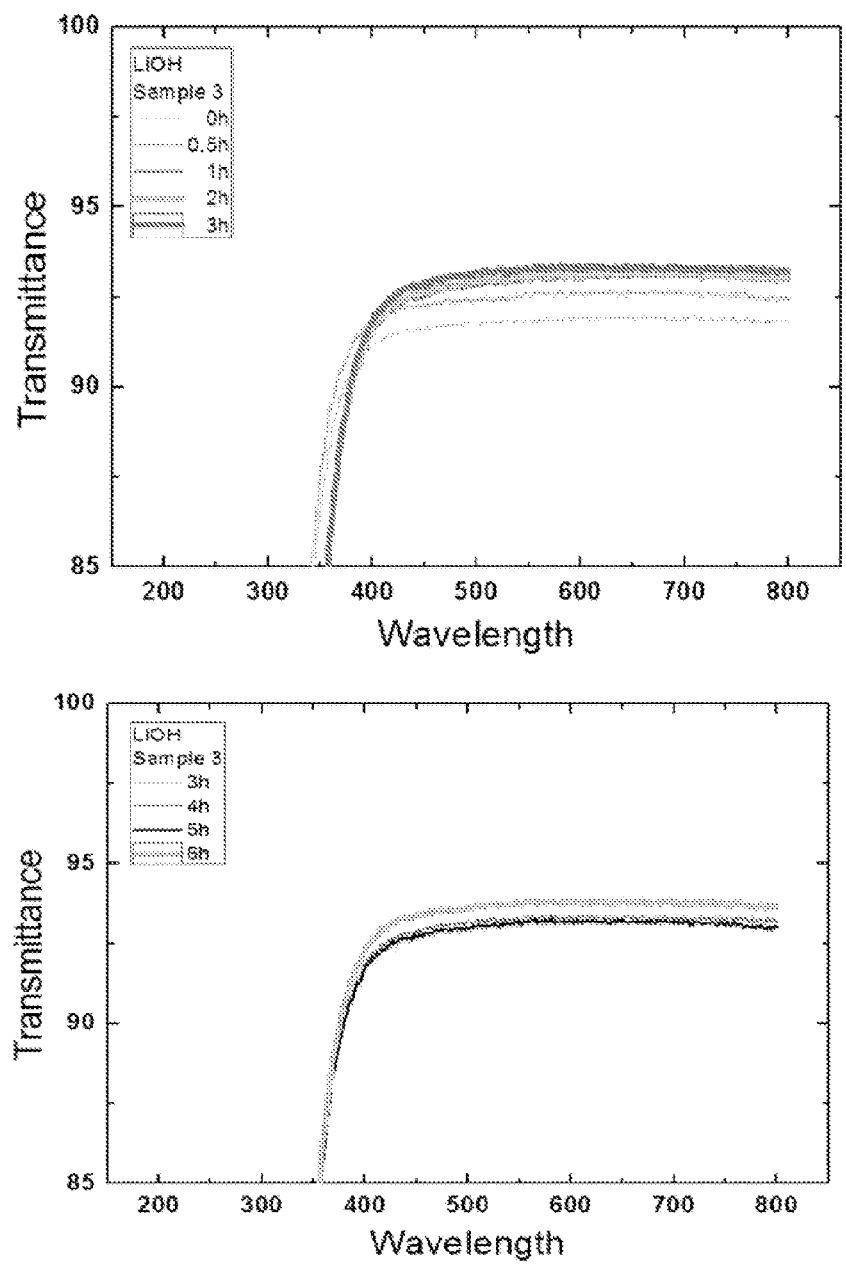
Figure 21:
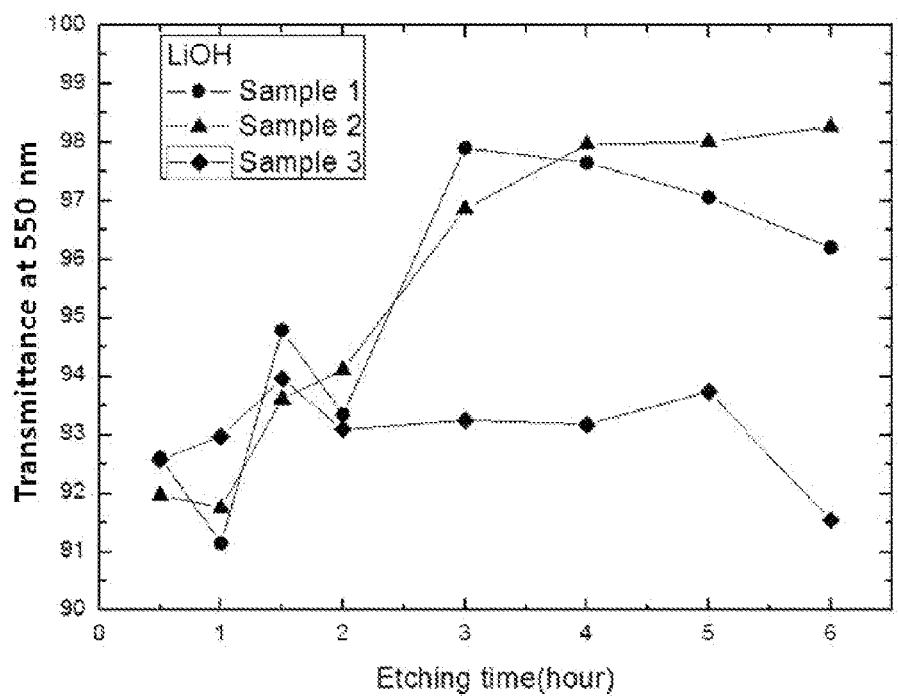
FIG. 21 is a view showing variations in the transmittance of sample 1, sample 2 and sample 3 at a specific wavelength (550 nm) depending on the etching times after being etched with LiOH.
Figure 22:
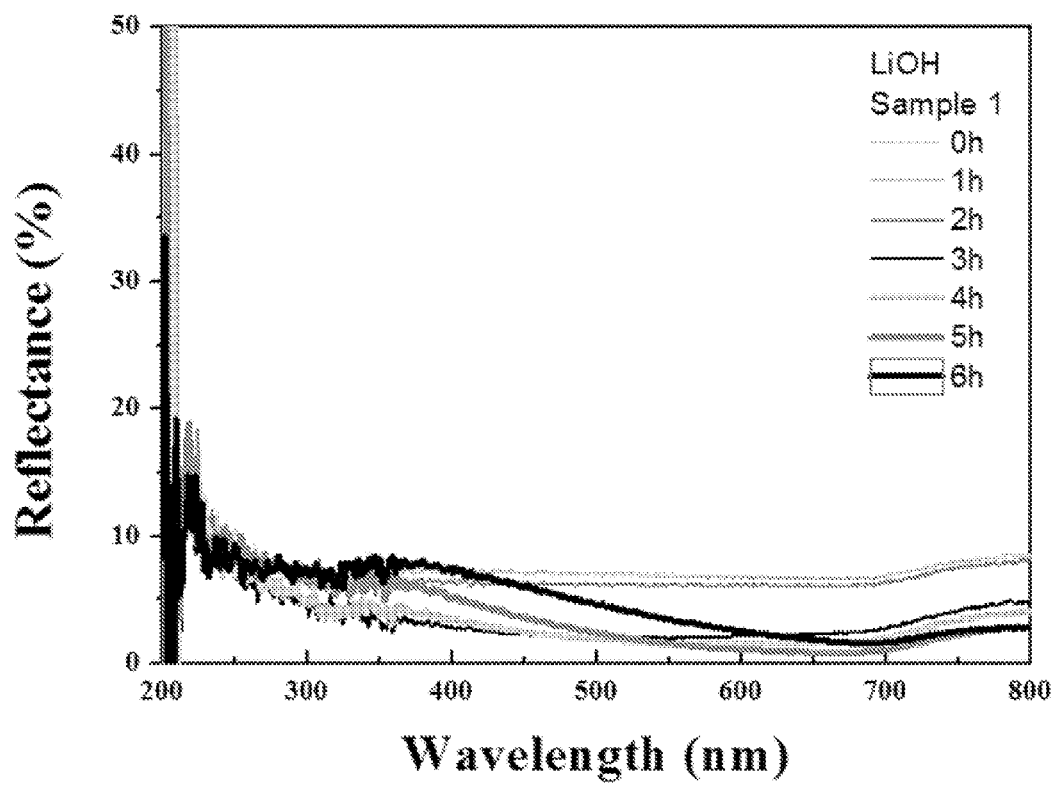
FIG. 22, FIG. 23 and FIG. 24 are views showing variations in the reflectance of sample 1, sample 2 and sample 3 depending on the wavelengths of light after being etched for several hours with a LiOH etching solution in the second embodiment of the invention.
Figure 23:
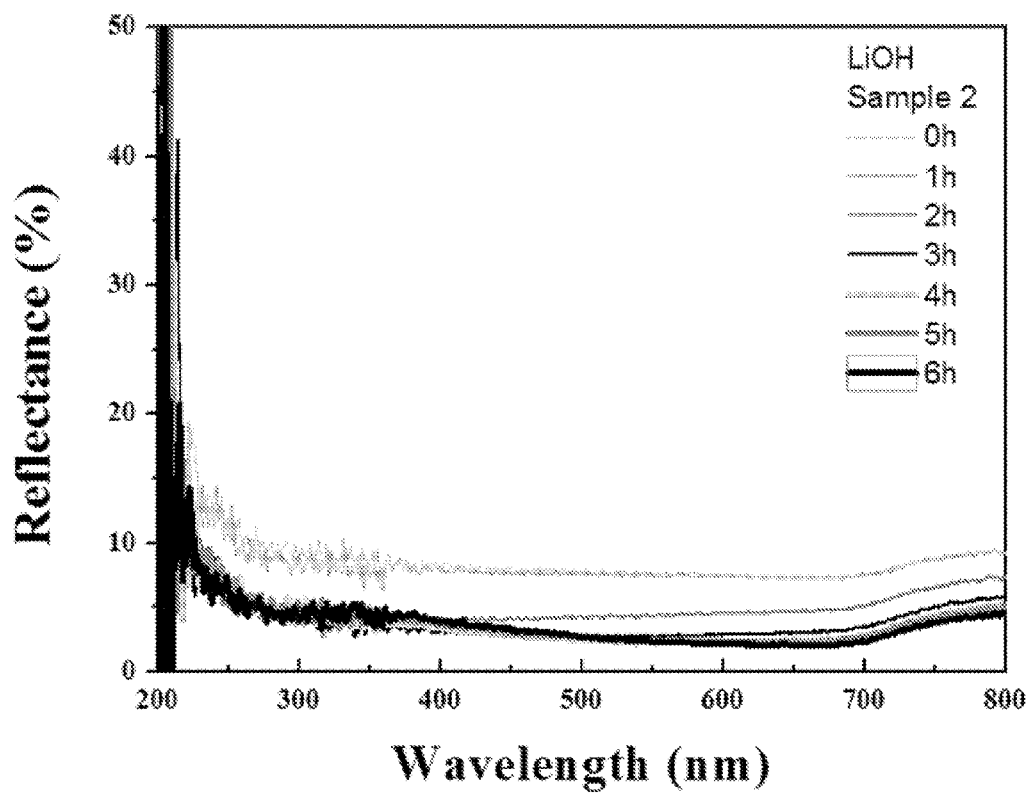
Figure 24:
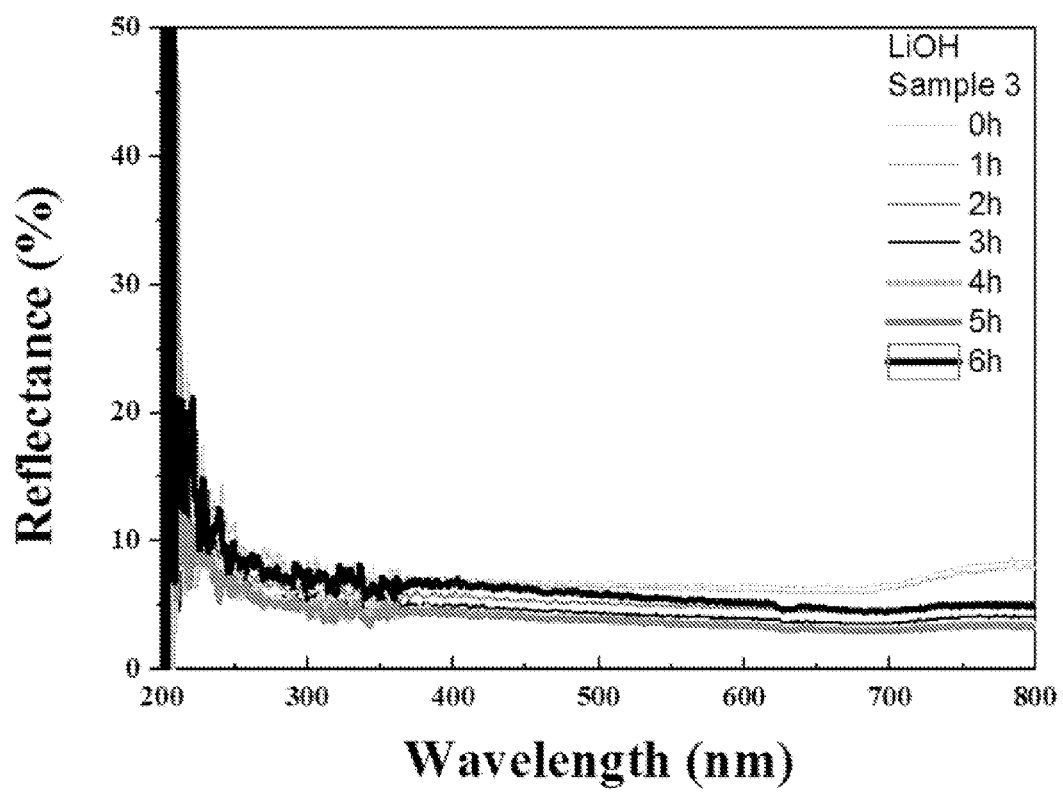
Figure 25:
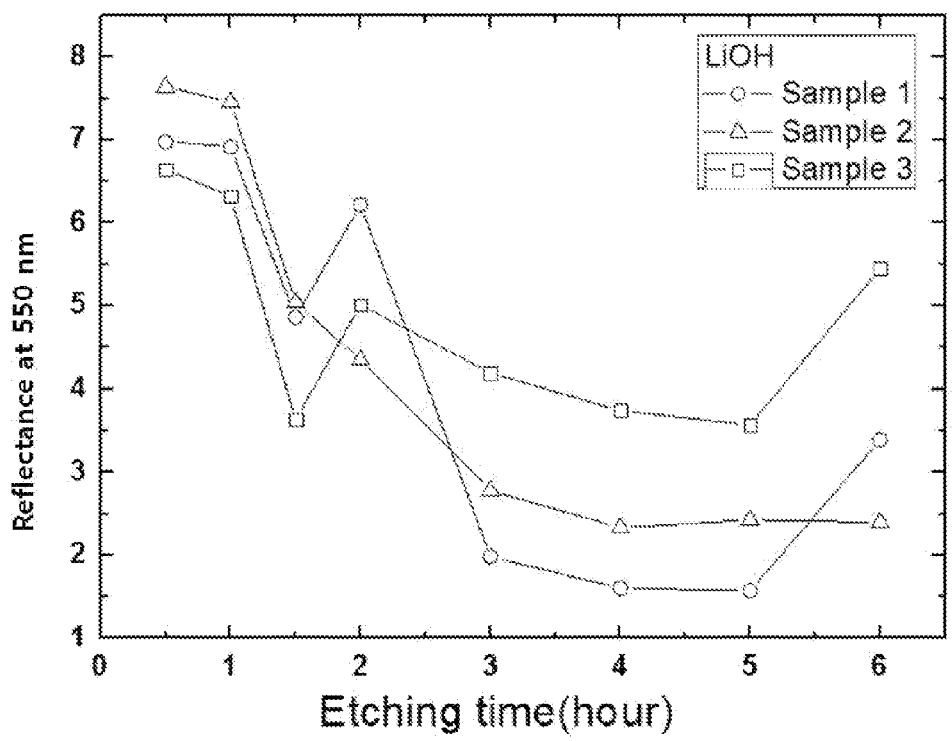
FIG. 25 is a view showing variations in the reflectance of sample 1, sample 2 and sample 3 at a specific wavelength (550 nm) depending on the etching times after being etched with LiOH.

In order to compare the corrosion behavior of different cations, changes in the atomic ratio of M/Si (M refers to cations in the glass) are calculated as a function of etching time. FIG. 9 shows variations in the atomic ratio (M/Si) that change as a function of etching time of glass substrates, in which (a) shows a Na/Si ratio, and (b) shows an Al/Si ratio.

For glass substrate A, the Na ratio decreases sharply, whereas the Al ratio increases slightly as the etching time increases. For glass substrate B, variations in the Na ratio are slightly slower than those of glass A and slow down and finally tend to be saturated after a long etching time. For glass substrate C, the Na ratio is stable at a very low concentration after being etched. For glass substrates A and B, the Al content is low and slightly increases after being etched. For glass substrate C, the Al content is very high and decreases as the etching time increases. A saturation behavior is also observed after a long etching time.

In soda-lime glass substrates A and B, a quick decrease in the Na ratio indicates fast ion exchange. The bonding energy between a Na ion and non-bridge oxygen is so low (94 KJ/mol) that this bonding can be easily attacked, in comparison to Si—O—Si network bonding (443 KJ/mol). The Al—O bonding is relatively resistant to ion exchange due to high bonding energy (330 kJ/mol to 422 kJ/mol). Thus, the atomic ratio of Al in soda-lime glass substrates A and B shows very small variations during etching. For aluminosilicate glass substrate C, the Na content is so low that etching channels will be initiated by dissolution of Al. Therefore, the ratio of Al decreases significantly as etching is prolonged.

The morphology can be determined by the composition of glass. In soda-lime glass substrates A and B, the Na ratios are high, which are attacked first by ion exchange. Following this process, water molecules diffuse through voids left by the reaction and undergo hydrolysis and dissolution. Etching selectively takes place much faster at the original Na ion sites, and pores can be formed at these sites after the formation of a new network. Therefore, for soda-lime glass substrate A having a much higher Na content, the number of pores is greater and the size of pores is smaller than those of soda-lime glass B having a lower Na content. For aluminosilicate glass substrate C, the Na content is very low and etching is more likely to occur at Al sites. Hence, the number of pores is much smaller and the size of pores is much greater compared to those of the soda-lime glass substrates.

The analysis results can be summarized as follows. In order to etch a piece of glass, an etchant that can etch the glass, for example, an alkali solution etchant (KOH in this embodiment) is used, and processing temperature is relatively low (about 95° C.). The etched glass exhibits a surface having a nanoporous structure that has a predetermined thickness, preferably, a thickness that is ¼ of the wavelength of incident light, at both side surfaces. Reflection was efficiency decreased and transmittance was enhanced over a wide range of wavelengths. The porous antireflection layer is less dependent on the angle, and thus exhibits antiglare effect. This is important for many devices such as displays. This process does not require an additional porous coating on the glass. This can be beneficial to mechanical stability (e.g. abrasion resistance). In addition, the etchant that is employed in the invention does not contain any harmful material, such as HF or fluoride, and thus does not lead to the problem as described in the Background Art section. In addition, the surface exhibits the super-hydrophilic property, and the antifogging effect is also proven, which is advantageous for devices which operate outdoors, such as in the high-humidity environment or in the water. The morphology, composition, surface and optical properties are properly controlled by varying the original composition and etching time.

2. Second Embodiment

KOH was used as an etching solution in the first embodiment. The inventors also tested whether or not results similar to those of the first embodiment will be obtained when another strong base solution is used, and the results will be described below.

The inventors additionally prepared three sorts of glass having compositions presented in Table 2, and carried out experiments on the three sorts of glass.

TABLE 2

| Sample No. | $SiO_2$ | $Na_2O$ | CaO | MgO | $Al_2O_3$ |
|---|---|---|---|---|---|
| Sample 1 | 66.75 | 19.86 | 5.62 | 6.23 | 1.54 |
| Sample 2 | 68.91 | 22.37 | 3.26 | 5.46 | 0 |
| Sample 3 | 65.96 | 0 | 3.87 | 3.47 | 26.7 |

As in the first embodiment, sample 1 to sample 3 are typical forms of glass that can be easily obtained from the surroundings. Sample 1 and sample 2 are soda-lime glasses, and sample 3 is glass that is used for a liquid crystal display (LCD).

First, like the first embodiment, organic matters were removed from the glass surface by carrying out piranha cleaning using sulphuric acid and hydrogen peroxide at a ratio of 3:1. In sequence, etching was carried out by dipping the samples in sodium hydroxide (NaOH) or lithium hydroxide (LiOH) solutions having a concentration of 0.1 M for a certain period of time. At this time, the temperature of the etching solutions was 95° C. Immediately after the samples were taken out, they were cleaned with tertiary DI water.

For these samples, transmittance and reflectance were measured like the first embodiment, and the results are presented in FIG. 10 to FIG. 25.

First, referring to FIG. 10 to FIG. 13 that show transmittances after the samples were respectively etched with the NaOH solution, like the first embodiment, it is apparent that the transmittance increases with the etching time in the range of the wavelength of light approximately from 300 nm to 800 nm, compared to the unetched sample. Like the first embodiment, when a strong base solution (alkali solution) such as NaOH is used as in this embodiment, a nanoporous layer having a predetermined thickness (preferably, ¼ of the wavelength of incident light) is formed on the glass surface, thereby increasing the transmittance. The reflectance also tends to increase as the transmittance increases (see FIG. 14 to FIG. 17). For sample 1, the transmittance slightly decreases at a specific wavelength (550 nm) after being etched for 4 hours. However, in general, the transmittance of the respective sample has a tendency to decrease sharply due to the increase in haze when the etching time exceeds 4 hours. Therefore, according to an exemplary embodiment of the invention, it is preferred that the etching time do not exceed 4 hours.

In sequence, referring to FIG. 18 to FIG. 21 that show transmittances after the samples were respectively etched with the LiOH solution, like the first embodiment and the samples etched with NaOH, it is apparent that the transmittance increases with the etching time in the range of the wavelength of light approximately from 300 nm to 800 nm. Like the former example, when a strong base solution (alkali solution) such as LiOH is used, a nanoporous layer having a predetermined thickness (preferably, ¼ of the wavelength of incident light) is formed on the glass surface, thereby increasing the transmittance. The reflectance also tends to increase as the transmittance increases (see FIG. 22 to FIG. 25). When the etching time exceeds approximately 4 hours, the transmittance decreases due to the increase in haze. This tendency is similar to that of the former example etched with NaOH. Therefore, according to an exemplary embodiment of the invention, it is preferred that the etching time do not exceed 4 hours.

Figure 26:
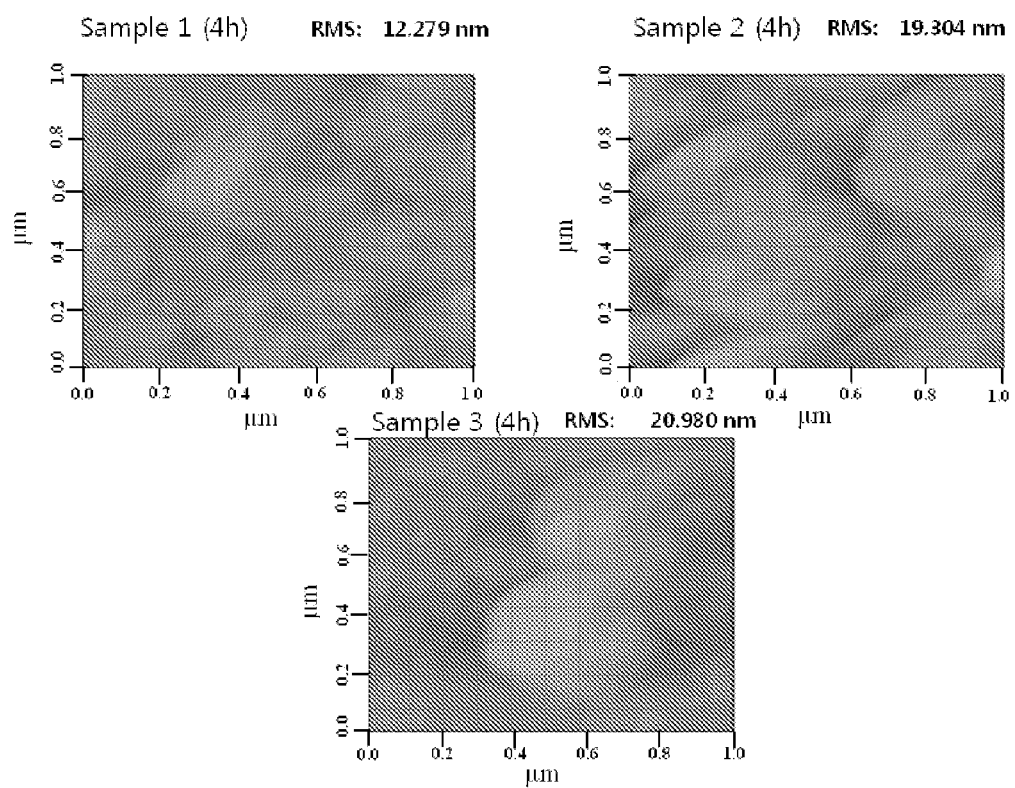
FIG. 26 show atomic force microscopy (AFM) data of sample 1, sample 2 and sample 3 after being etched with NaOH, in which a nano-porous layer having a surface roughness ranging from 10 nm to 20 nm is formed on the glass surface.

The inventors carried out atomic force microscopy (AFM) analysis on the surfaces of sample 1 to sample 3 that were treated for 4 hours with the NaOH solution, and the results are presented in FIG. 26. As shown in FIG. 26, it is apparent that a nanoporous structure having a surface roughness approximately from 10 nm to 20 nm was formed on the surface. This nanoporous structure leads to the increased transmittance and the decreased reflectance of glass. A description will be given of the reasons with reference to FIG. 27.

Figure 27:
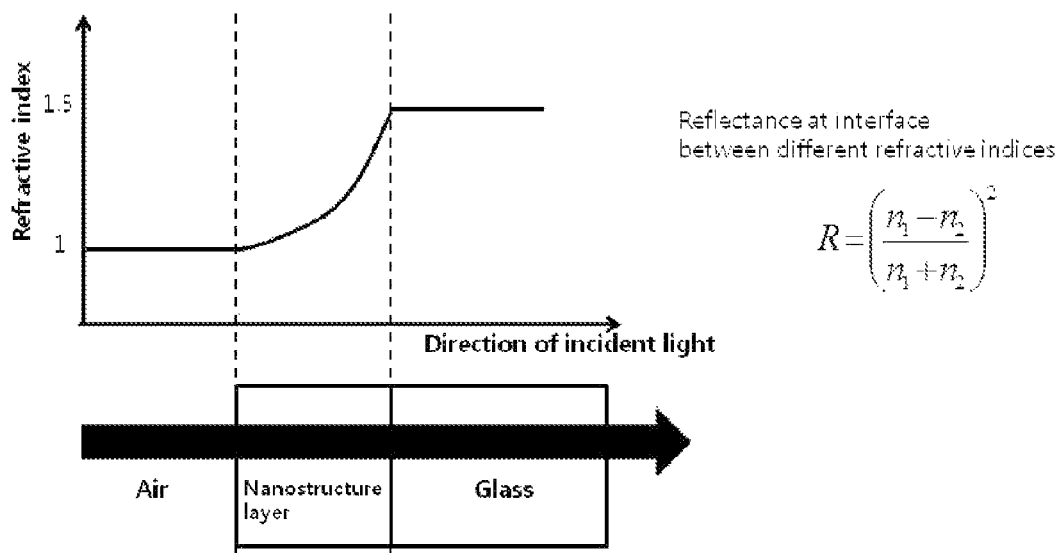
FIG. 27 is a view schematically showing variations in the refractive index when a nanoporous layer is formed on the glass surface according to the present invention.

FIG. 27 is a view schematically showing variations in the refractive index when a nanoporous layer is formed on the glass surface according to the present invention. As described above, a nanoporous layer having a refractive index that varies between air (refractive index=1) and glass (refractive index=1.5) is formed on the surface of glass according to the invention. The reflectance on the interface between different refractive indices can be expressed as follows.

$$R = \left(\frac{n_1 - n_2}{n_1 + n_2}\right)^2 \quad \text{[Formula 7]}$$

When there is no nanoporous layer unlike the invention, intermittent variations in the refractive index have a specific value of R. In contrast, when a nanoporous layer is formed on the glass surface as in the invention, the refractive index continuously varies instead of being intermittent. The R value theoretically approaches 0. Therefore, the R value is very small compared to the case without a nanoporous layer, and it is possible to significantly decrease reflection on the glass surface according to the invention.

As described above, like the first embodiment, it is apparent that the second embodiment can also form a nanoporous layer on the glass surface even when a different sort of alkali solution is used, thereby decreasing reflectance and increasing transmittance. It can also be appreciated that antireflection effect and high transmittance performance can be realized due to the etching treatment for less than 4 hours.

The invention also relates to various devices including a glass substrate which is manufactured by the above-described method. For example, the invention can be applied to the following applications.

A. Self-cleaning Glass

B. High-Transmittance Substrate for Photocatalyst

The problem of current self-cleaning glass using a photocatalyst $TiO_2$ is that the transmittance gradually decreases. In contrast, when the glass substrate of the invention is used, no $TiO_2$ layer is added. It is also possible to overcome the problem in that the self-cleaning property decreases over time.

C. Photovoltaic Cell

The invention can be applied to photovoltaic cells including thin-film photovoltaic devices. For example, the use of the invention can include cover glasses for crystal silicon type PVs, TCO glass substrates for thin-film PVs, protective glasses for PV systems and the like. Specifically, a dye-sensitized photovoltaic cell includes a transparent substrate, a conductive transparent electrode which is formed on the surface of the transparent substrate, an oxide semiconductor electrode which includes a metal oxide nanoparticle layer on which photosensitive dye capable of absorbing light is adsorbed, a counterpart electrode, and electrolyte which is disposed between the transparent substrate and the counterpart electrode. The transparent substrate is generally implemented as a common glass substrate. For not only the dye-sensitized photovoltaic cell but also for thin-film photovoltaic cells each of which includes a glass substrate, a front electrode, a semiconductor part which is formed on the front electrode and a rear electrode, the efficiency increases when as much light as possible is absorbed, i.e. as little light as possible is reflected. Conventionally, a method of forming an additional coating layer is proposed in order to increase the light transmittance. However, according to the invention, it is possible to decrease the light reflectance and increase the light transmittance without an additional coating layer. Therefore, it is expected that the invention can increase the efficiency of photovoltaic cells when applied thereto.

D. Display Device

From among display devices, such as liquid crystal displays (LCDs), organic light-emitting diodes (OLEDs) and plasma display devices (PLDs), especially LCDs are widely used since high resolution can be realized and miniaturization/upsizing is possible. Such an LCD includes a LCD module and a protective filter for protecting the LCD module. When the LCD is used outdoors, it is directly influenced by the external environment, and the LCD module is in a danger in that it can be exposed to external impacts. Thus, a protective filter for protecting the LCD module is disposed and used in front of the LCD module. The protective filter includes a transparent substrate, a transparent conductive film which is formed on the substrate and an electrode part which is electrically connected to the transparent conductive film. In some embodiments, an additional layer (film) is formed on the protective filter in order to decrease reflection or for the purpose of antifogging. However, when the glass substrate of the invention is applied as the transparent substrate of the protective filter, it is possible to decrease the reflection of light and realize the antifogging function without forming an additional layer.

In addition, recently, touch panels are widely used, in which a transparent electrode such as indium tin oxide (ITO) is typically formed on the transparent electrode. When the glass substrate of the invention is applied as the transparent substrate, the effects of decreasing the reflection of light and increasing the transmittance of light are achieved.

Furthermore, for table personal computers (PCs) or smart phones, a piece of protective glass is disposed on the front. The protective glass is required to decrease reflection and glare so that images can be more clearly viewed. The invention can also be applied to the protective film for tablet PCs or smart phones.

E. Rearview Mirror for Vehicle

An inside mirror which provides a view of what is behind, i.e. a rearview mirror, is essentially disposed inside a vehicle. The rearview mirror basically includes a mirror housing which is pivotably disposed on a mounting portion which is fixed to a windshield of the vehicle, a mirror member which is mounted such that it occupies an opening of the mirror housing, and a mirror housing cover which fixes the mirror member. The rearview mirror is required to prevent a driver from being dazzled by light that is radiated from headlights of a rear vehicle. Since the glass of the invention can significantly decrease the reflection of light as described above, when the glass of the invention is applied to the mirror member of the rearview mirror for a vehicle, the effect of decreasing glare that is caused by light radiated from the headlights of the rear vehicle can be realized without any additional means. In addition, since the antifogging property can also be imparted, the effect of preventing the rearview mirror for a vehicle from fogging due to the temperature difference. Furthermore, the glass of the invention can be applied to side-view mirrors which are disposed on the both side sections of the exterior of the vehicle, as well as to the rearview mirror.

F. Others

The invention can be applied to lenses for optical devices and optoelectronic devices which require high transmittance, and can be widely applied to windshields for vehicles, lamps, glasses for buildings, eyeglasses, and the like.

Although the invention has been described hereinabove with respect to the certain embodiments, it should be understood that the invention is not limited to the foregoing embodiments. The invention can be variously modified and changed within the scope of the appended claims, and such modifications and changes fall within the scope of the invention. Therefore, it should be understood that the scope of the invention shall be defined only by the appended claims and the equivalents thereof.

The invention claimed is:

1. A method of manufacturing an antireflective glass, the method comprising:
   cleaning a surface of a glass;
   forming a porous structure of nanoscale pores on the cleaned surface of the glass in a thickness direction of the glass by immersing the glass in an alkali solution etchant at a temperature of less than 100° C., etching the cleaned surface of the glass with the alkali solution etchant for 4 hours or less than 4 hours, the etchant being a substitute for hydrofluoric acid (HF) or fluoride such that HF or fluoride is not used as the etchant,
   wherein the porous structure is formed only by cleaning the surface of the glass and etching the glass with the alkali solution etchant, the etching not requiring any other additional processes, and
   wherein the porous structure is formed on the cleaned surface of the glass without forming a separate coating layer on the surface of the glass.

2. The method according to claim 1, wherein the etching of the glass forms the porous structure by etching the surface of the glass, not by etching the separate coating layer which covers the surface of the glass.

3. The method according to claim 2, wherein the layer having the porous structure imparts the glass with at least one property selected from among an antireflection property, a hydrophilic property and an antifogging property.

4. The method according to claim 2, wherein the layer having the porous structure has a refractive index value that continuously varies between a refractive index of air and a refractive index of the glass.

5. The method according to claim 1, wherein a depth of the layer having the porous structure is smaller than a wavelength of incident light.

6. The method according to claim 5, wherein the depth of the layer having the porous structure is ¼ or less of the wavelength of the incident light.

7. The method according to claim 1, wherein the alkali solution etchant is a potassium hydroxide (KOH) solution.

8. The method according to claim 7, wherein forming the porous structure does not require any heat treatment.

9. The method according to claim 1, wherein the etching is carried out for a time period that is in a range from 0.5 hour to 4 hours.

10. The method according to claim 9, wherein the etching is carried out for a time period that is in a range from 1.5 hour to 2 hours.

11. The method according to claim 1, wherein the alkali solution etchant is NaOH or LiOH.

12. The method according to claim 11, wherein the etching in the alkali solution etchant is carried out at a temperature below 100° C.

13. The method according to claim 1, wherein the cleaning the glass is performed before the etching is performed by carrying out piranha cleaning using sulphuric acid and hydrogen peroxide at a ratio of 3:1.

* * * * *